(12) United States Patent
Kerzman et al.

(10) Patent No.: US 6,684,376 B1
(45) Date of Patent: Jan. 27, 2004

(54) METHOD AND APPARATUS FOR SELECTING COMPONENTS WITHIN A CIRCUIT DESIGN DATABASE

(75) Inventors: Joseph P. Kerzman, New Brighton, MN (US); James E. Rezek, Mounds View, MN (US); Mark D. Aubel, Essex Jct., VT (US); Merwin H. Alferness, New Brighton, MN (US)

(73) Assignee: Unisys Corporation, Blue Bell, PA (US)

(*) Notice: Subject to any disclaimer, the term of this patent is extended or adjusted under 35 U.S.C. 154(b) by 0 days.

(21) Appl. No.: 08/789,026

(22) Filed: Jan. 27, 1997

(51) Int. Cl.[7] .......................... G06F 17/50; G06F 9/455
(52) U.S. Cl. .................................. 716/8; 716/9; 716/10; 716/11
(58) Field of Search ................................ 364/488, 489, 364/490, 491; 716/8, 9–10

(56) References Cited

U.S. PATENT DOCUMENTS

| | | | |
|---|---|---|---|
| 4,758,953 A | 7/1988 | Morita et al. | |
| 4,831,543 A | 5/1989 | Mastellone | |
| 4,918,614 A | 4/1990 | Modarres et al. | |
| 5,050,091 A | 9/1991 | Rubin | |
| 5,155,836 A | * 10/1992 | Jordan et al. ................ | 364/488 |
| 5,164,908 A | 11/1992 | Igarashi | |
| 5,175,696 A | 12/1992 | Hooper et al. | |
| 5,222,029 A | 6/1993 | Hooper et al. | |
| 5,255,363 A | 10/1993 | Seyler | |
| 5,267,175 A | 11/1993 | Hooper | |
| 5,341,309 A | 8/1994 | Kawata | |
| 5,349,659 A | 9/1994 | Do et al. | |
| 5,355,317 A | 10/1994 | Talbott et al. | |
| 5,357,440 A | 10/1994 | Talbott et al. | |
| 5,359,523 A | 10/1994 | Talbott et al. | |
| 5,359,537 A | 10/1994 | Saucier et al. | |
| 5,361,357 A | 11/1994 | Kionka | |
| 5,398,195 A | * 3/1995 | Kim ............................ | 364/491 |
| 5,406,497 A | 4/1995 | Altheimer et al. | |
| 5,416,721 A | 5/1995 | Nishiyama et al. | |
| 5,418,733 A | 5/1995 | Kamijima | |
| 5,418,954 A | 5/1995 | Petrus | |
| 5,440,720 A | 8/1995 | Baisuck et al. | |
| 5,483,461 A | 1/1996 | Lee et al. | |
| 5,485,396 A | 1/1996 | Brasen et al. | |
| 5,490,266 A | 2/1996 | Sturges | |
| 5,490,268 A | 2/1996 | Matsunaga | |
| 5,491,640 A | 2/1996 | Sharma et al. | |
| 5,493,508 A | 2/1996 | Dangelo et al. | |
| 5,515,293 A | * 5/1996 | Edwards ...................... | 364/489 |
| 5,528,508 A | * 6/1996 | Russell et al. ................. | 716/8 |
| 5,663,893 A | * 9/1997 | Wampler et al. ............. | 364/491 |
| 5,689,433 A | * 11/1997 | Edwards ...................... | 364/490 |
| 5,706,295 A | * 1/1998 | Suzuki ........................ | 364/488 |
| 5,712,794 A | * 1/1998 | Hong .......................... | 364/491 |
| 5,798,752 A | * 8/1998 | Buxton et al. .............. | 345/863 |
| 5,889,677 A | * 3/1999 | Yasuda et al. ................. | 716/6 |

OTHER PUBLICATIONS

Tufte, "CML III Bipolar Standard Cell Library", Proceedings of the 1988 Bipolar Circuits and Technology Meeting, Minneapolis Minnesota, Sep., 1988, pp. 180–182.

* cited by examiner

*Primary Examiner*—Hugh Jones
(74) *Attorney, Agent, or Firm*—Charles A. Johnson; Mark T. Starr; Nawrocki, Rooney & Sivertson, P.A.

(57) ABSTRACT

A method and apparatus for efficiently selecting cells within a circuit design database. The invention includes four primary features for selecting cells including (1) selecting only those cells that are in a pre-identified region and within a pre-identified selection area; (2) maneuvering through the circuit design hierarchy and selecting cells or regions at selected levels of hierarchy by using predetermined up and down hot-keys; (3) sorting selected cells by instance name, and manually selecting a desired cell or region from the resulting sorted list; and (4) sorting selected cells by a corresponding net name, and manually selecting a desired cell or region from the resulting sorted list.

28 Claims, 22 Drawing Sheets

FIG. 17A

| UN-PLACED CELLS - UNSORTED | | |
|---|---|---|
| ADD0001 | XADRS(0)...XADRS(4) | ADDOUT(0)...ADDOUT(4) |
| MUX021 | XADRS(0)...XADRS(4) | MUXOUT(0)...MUXOUT(4) |
| ALUBB3 | ADDOUT(0)...ADDOUT(4) | ALU(0)...ALU(4) |
| PARTY22 | MUXOUT(0)...MUXOUT(4) | PARITYOUT |
| REG321 | ALU(0)...ALU(4) | OUT(0)...OUT(4) |

FIG. 17B

| UN-PLACED CELLS - SORTED BY INSTANCE NAME | | |
|---|---|---|
| ADD0001 | XADRS(0)...XADRS(4) | ADDOUT(0)...ADDOUT(4) |
| ALUBB3 | ADDOUT(0)...ADDOUT(4) | ALU(0)...ALU(4) |
| MUX021 | XADRS(0)...XADRS(4) | MUXOUT(0)...MUXOUT(4) |
| PARTY22 | MUXOUT(0)...MUXOUT(4) | PARITYOUT |
| REG321 | ALU(0)...ALU(4) | OUT(0)...OUT(4) |

FIG. 20A

| | UN-PLACED CELLS - UNSORTED | | | | |
|---|---|---|---|---|---|
| 628B | MUX021 | XBUS(0) | YBUS(0) | PBUS(0) | NBUS(0) |
| 612B | A101 | XBIT(0) | XEN | XBUS(0) | |
| 620B | A352 | YBIT(0) | YEN | YBUS(0) | |
| 630B | MUX245 | XBUS(1) | YBUS(1) | PBUS(1) | NBUS(1) |
| 634B | MUX432 | XBUS(3) | YBUS(3) | PBUS(3) | NBUS(3) |
| 626B | A923 | YBIT(3) | YEN | YBUS(3) | |
| 622B | A112 | YBIT(1) | YEN | YBUS(1) | |
| 624B | A415 | YBIT(2) | YEN | YBUS(2) | |
| 618B | A642 | XBIT(3) | XEN | XBUS(3) | |
| 614B | A345 | XBIT(1) | XEN | XBUS(1) | |
| 616B | A214 | XBIT(2) | XEN | XBUS(2) | |
| 632B | MUX127 | XBUS(2) | YBUS(2) | PBUS(2) | NBUS(2) |

| | UN-PLACED CELLS - SORTED BY PRESELECTED OUTPUT NET | | | | |
|---|---|---|---|---|---|
| 628B | MUX021 | XBUS(0) | YBUS(0) | PBUS(0) | NBUS(0) |
| 630B | MUX245 | XBUS(1) | YBUS(1) | PBUS(1) | NBUS(1) |
| 632B | MUX127 | XBUS(2) | YBUS(2) | PBUS(2) | NBUS(2) |
| 634B | MUX432 | XBUS(3) | YBUS(3) | PBUS(3) | NBUS(3) |
| 612B | A101 | XBIT(0) | XEN | XBUS(0) | |
| 614B | A345 | XBIT(1) | XEN | XBUS(1) | |
| 616B | A214 | XBIT(2) | XEN | XBUS(2) | |
| 618B | A642 | XBIT(3) | XEN | XBUS(3) | |
| 620B | A352 | YBIT(0) | YEN | YBUS(0) | |
| 622B | A112 | YBIT(1) | YEN | YBUS(1) | |
| 624B | A415 | YBIT(2) | YEN | YBUS(2) | |
| 626B | A923 | YBIT(3) | YEN | YBUS(3) | |

682, 684, 686, 688 — 680

METHOD AND APPARATUS FOR SELECTING COMPONENTS WITHIN A CIRCUIT DESIGN DATABASE

CROSS REFERENCE TO CO-PENDING APPLICATIONS

The present application is related to U.S. patent application Ser. No. 08/789,025, filed Jan. 27, 1997, entitled "Method and Apparatus for Efficiently Viewing a Number of Selected Components Using a Database Editor Tool", U.S. patent application Ser. No. 08/789,024, filed Jan. 27, 1997, entitled "Method and Apparatus for Identifying Physical Errors in a Placement Database", U.S. patent application Ser. No. 08/789,027, filed Jan. 27, 1997, entitled "Method and Apparatus for Selectively Viewing Nets Within a Database Editor Tool", U.S. patent application Ser. No. 08/789,028, filed Jan. 27, 1997, entitled "Method and Apparatus for Associating Selected Circuit Instances and for Performing a Group Operation Thereon", U.S. patent application Ser. No. 08/789,029, filed Jan. 27, 1997, entitled "Method and Apparatus for Using a Placement Tool to Manipulate Cell Substitution Lists", U.S. patent application Ser. No. 08/598,506, filed Feb. 7, 1996 entitled "Method and Apparatus for Performing Drive Strength Adjust Optimization in a Circuit Design", U.S. patent application Ser. No. 08/597,931, filed Feb. 7, 1996 entitled "Method and Apparatus for Resolving Conflicts Between Cell Substitution Recommendations Provided by a Drive Strength Adjust Tool", all of which are assigned to the assignee of the present invention and all of which are incorporated herein by reference.

BACKGROUND OF THE INVENTION

1. Field of the Invention

The present invention generally relates to the manipulation of circuit components of a circuit design database and more particularly relates to a method and apparatus for selecting components.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. Note that the hierarchy is typically structured as a special kind of a graph called a tree. This resulting data structure is called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer creates more efficient logic in terms of space, power or timing, and may remove logic from the design that is unnecessary. It is noted, however, that this action typically affects the component and net names generated by the logic synthesis tool.

It is also necessary to verify that the logic definition is correct and that the integrated circuit implements the function expected by the circuit designer. This verification is currently achieved by estimated timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements. As a result of each revision to the design, the logic design synthesis-generated component and net names may completely change. Further, the changes made by the logic optimizer may not be precisely known. Thus, the EDA tools downstream in the design process from the logic design synthesis software must be re-executed on the entire design.

After timing verification and functional simulation has been completed on the design, placement and routing of the design's components is performed. These steps involve assigning components of the design to locations on the integrated circuit chip and interconnecting the components to form nets. This may be accomplished using automated place and route tools.

Because automatic placement tools may not yield an optimal design solution, particularly for high performance designs that have strict timing and physical requirements, circuit designers often manually place critical circuit objects (e.g. cells or regions) within the boundary of the integrated circuit. This may be accomplished by using a commercially available placement directive tool (also known as a floorplanning tool), typically implemented in software. The floorplanning tool may include a graphics terminal that provides the circuit designer with visual information pertaining to the circuit design. This information is typically contained in several different windows.

A floorplanning window may display a graphical representation of, for example, the die area of an integrated circuit, the placed objects and connectivity information. Similarly, a placed physical window may display the alphanumeric names of all placed cells and hierarchical regions. An un-placed physical window may display the alphanumeric names of all un-placed cells and hierarchical regions. A logic window may display a hierarchical tree graph of the circuit design.

During the placement process, the circuit designer may select the name of a desired object from the un-placed physical window displaying the un-placed objects. After this selection, the placement tool may retrieve the physical representation of the selected object, and the circuit designer may use the cursor to position the physical representation of the selected object within the floorplanning window. The placement tool may then move the alphanumeric name of the selected object from the un-placed physical window to the placed physical window to indicate the placement thereof.

To edit the placement of desired objects, the circuit designer typically selects the desired object from within the floorplanning window using a pointing device. The circuit designer may draw a rectangle around the desired objects to affect the selection. After selection, the circuit designer may instruct the placement tool to perform a desired editing function on the selected objects.

Some placement tools allow the circuit designer to select a desired level of hierarchy or region as the current working environment, or "context". When the context is set, all of the objects existing at the next lower level in the circuit design hierarchy are displayed in one of the physical windows, thus making them available for placement or editing. These objects are called children objects of the selected context, and may include other hierarchical objects, including regions and/or cells. Thus, a context may include a mixture of regions and cells.

In this environment, circuit designers may perform preliminary placement by first placing high level regions. In some placement tools, the outer boundaries of the regions are appropriately sized to accommodate all underlying objects, even though all of the objects may not yet be placed. Thus, the circuit designer may rely on an automated placement tool to subsequently position the underlying objects within the boundary of the region. If more detailed placement is required because of timing, physical or other constraints, selected lower level regions or cells may be manually placed by the circuit designer.

These prior art placement tools suffer from a number of limitations, some of which are described below. First, while some placement tools allow operations to be performed on a user-defined group of objects using a pointing device within the placement tool (for example, selecting all objects within a certain area on the display device), they do not allow groups to be defined using level's of logical hierarchy of the circuit design database. This provides a major limitation since many group operations are performed on a logical hierarchy basis. The ability to form groups based on the logical hierarchy can be particularly useful when multiple contexts overlap. In this situation, regions or cells within the overlapping contexts may be intermixed, and selecting only those regions or cells that correspond to a desired context can be difficult.

Furthermore, typical prior art placement tools do not allow a circuit designer to easily traverse the design hierarchy from within the floorplanning window, or easily select a desired context therein. In particular, if regions overlap, prior art tools typically cycled through the various overlapping regions until the desired region is finally located by the circuit designer. This could be a slow and tedious process because the regions may be large, including thousands of gates. Further, the selection process often involved loading the context information into local memory.

In addition to the above, typical prior art placement tools do not provide a mechanism for easily identifying selected objects for placement. In prior placement tools, when a context was loaded, the children cells appeared as a pseudo random list of names in a physical window. Since large contexts often contain thousands of regions and/or cells, the physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement. Largely because of this tedious process, circuit designers often opted not to perform manual placement.

SUMMARY OF THE INVENTION

The present invention overcomes many of the disadvantages of the prior art by providing a method and apparatus for selecting components within a circuit design database. A number of features are provided for increasing the efficiency of the selection process. A first feature includes selecting only those objects that are in both a selected area and in a selected context. This feature may be particularly useful when multiple contexts overlap. In a preferred embodiment, this is accomplished by allowing only those cells that are associated with the selected context to be selected with a pointer device.

A second feature includes maneuvering through the circuit design hierarchy, and selecting cells or regions by using predetermined up and down hot-keys. This feature may allow a circuit designer to select a predetermined context by selecting a leaf cell known to be within the predetermined context by hitting a predetermined down hot-key, and then hitting an up hot-key to select the predetermined context. The up and down hot-key feature may allow a circuit designer to easily change the current context from within the floorplanning window to a different hierarchical level within the circuit design.

A third feature of the present invention includes sorting the un-placed objects by instance name, and manually selecting a desired object from the resulting sorted list. In prior placement tools, and as indicated above, when a context was loaded, the children objects appeared as a pseudo random list of names in a physical window. Since large contexts often contain thousands of instance names, the physical window provided little utility during the placement process. The circuit designer had to scroll through the often lengthy list of instances in an attempt to identify the desired object. It was often more efficient for the circuit designer to determine an instance name by cross-referencing an external listing so that the name could be entered manually prior to placement. Largely because of this tedious process, circuit designers often opted to not perform manual placement. In the present invention, the objects associated with a context may be sorted by instance or other name. This provides a readily understood order to the objects, thus enabling the circuit designer to quickly identify a desired object.

A fourth feature of the present invention includes sorting the un-placed objects by a corresponding net name, and manually selecting a desired object from the resulting sorted list. All of the un-placed objects are typically connected to at least one net within the design. For example, un-placed objects typically have an output which is coupled to a net. If the circuit design is generated by a synthesis tool, as described above, some of the net names will be computer generated. However, many synthesis tools retain the net names defined in the high level behavioral level description of the circuit design, particularly for vectored nets and the like. In these synthesis tools, the net names for each bit in a vectored net may have the same net name as a prefix with a bit number as a suffix (for example, NET1(0)). By sorting the instances according to the net names associated with a selected output, a circuit designer may easily select and place all objects associated with a vectored net. That is, all drivers of a vectored net may be sequentially listed in a physical window by sorting the instances by net name. This allows each of the instances to be easily placed in the floorplanning window.

A further advantage of both of the net name and instance name sorting features is that circuit designers may easily define object groups. This may allow user defined group operations to be more readily performed. For example, a circuit designer may place all drivers for a vectored net by: (1) performing an instance sort by net name; (2) selecting a first component from the group; (3) placing the first component; (4) specifying a direction for further group placement; and (5) automatically placing the remaining cells within the group in the specified direction (see for example, U.S. patent application Ser. No. 08/789,028, filed Jan. 27, 1997, which has been incorporated herein by reference). In the past, this simple operation typically required the circuit designer to manually find each instance name, either from some external printout or by panning through the unsorted list within a physical window, and individually place each object in the floorplanning window.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 17A is a table showing an illustrative unsorted un-placed physical window of a placement tool for the circuit design shown in FIG. 16;

FIG. 17B is a table showing an illustrative sorted un-placed physical window of a placement tool for the circuit design shown in FIG. 16, wherein the objects are sorted by instance name;

FIG. 20A is a table showing an illustrative unsorted un-placed physical window of a placement tool for the circuit design shown in FIG. 19;

FIG. 20B is a table showing an illustrative sorted un-placed physical window of a placement tool for the circuit design shown in FIG. 19, wherein the objects are sorted by a corresponding output net name;

DETAILED DESCRIPTION OF THE PREFERRED EMBODIMENTS

Figure 1:
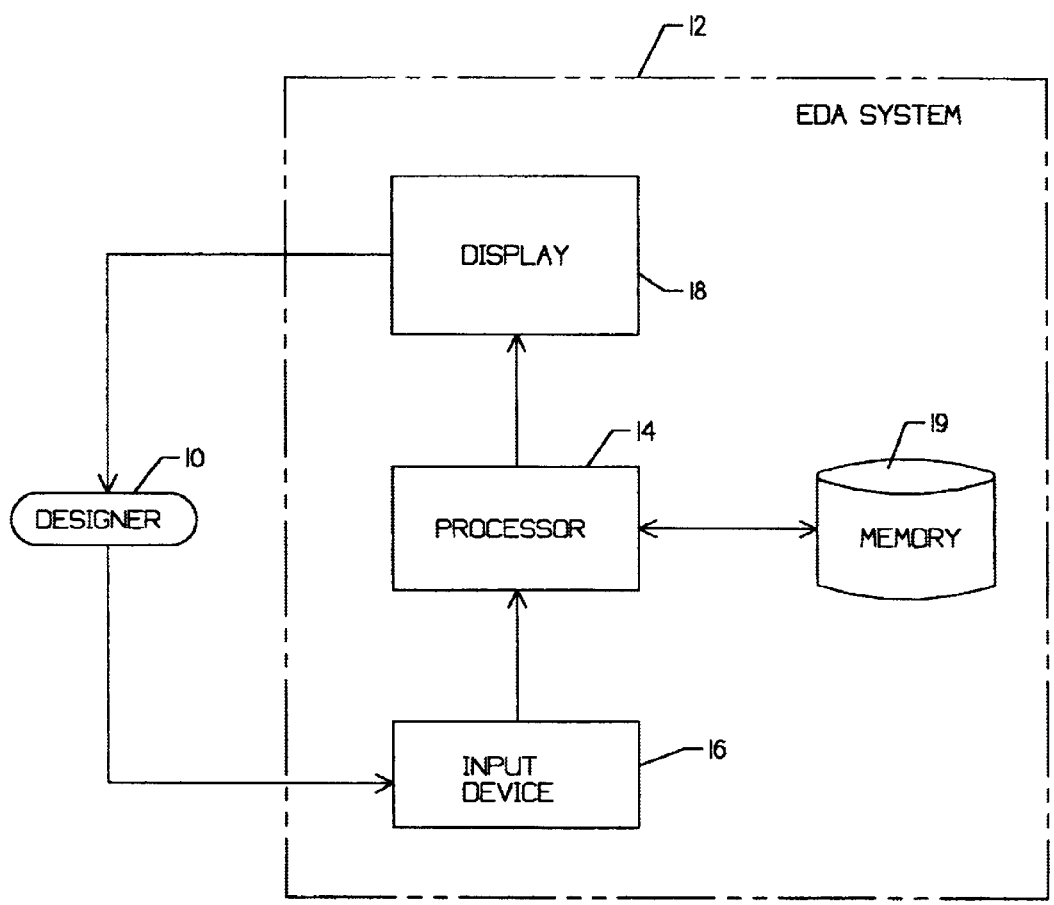
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floorplan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floorplanning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process usually includes a manual and automated portion, executed by the circuit designer and EDA software.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 19. The Memory may take the form of a semiconductor memory, magnetic disks, optical disks, magnetic tape or other mass storage device.

Figure 2:
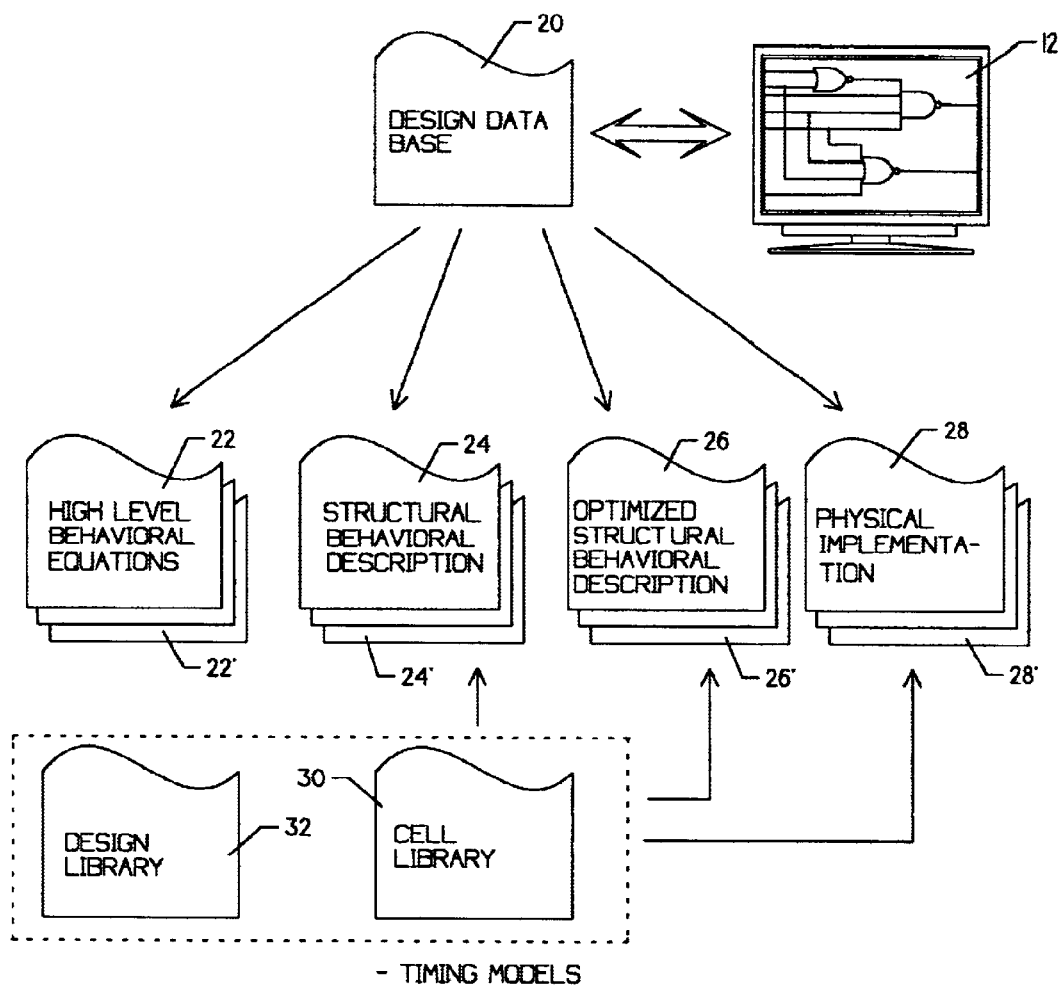
FIG. 2 is a block diagram showing typical circuit representations stored within a circuit design database.

FIG. 2 is a block diagram showing a number of circuit representations stored within a typical circuit design database. For example, the design database may include a high level behavioral representation 22, a structural behavioral description representation 24, an optimized structural behavioral representation 26, and a physical representation 28.

As indicated above, the circuit designer typically specifies the logic design of an integrated circuit by using design capture software that runs on an electronic design automation system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 map to functional components of the design. In the preferred embodiment, the high level behavior description representation 22 is written in a design language called Universal Design Source Language (UDSL), although other existing, well-known hardware design languages could also be used.

The high level behavior description representation 22 may be input to a logic design synthesis tool. The logic design synthesis tool may assign the gates and other circuitry needed to implement the functions specified by the high level behavior description representation 22. In the preferred embodiment, the synthesis software comprises the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural behavioral description representation 24, which is sometimes referred to as the net list for the design. This file contains the gate-level definition of the logic design. The structural behavioral description representation 24 may be in the Prime Behavior Description Language ('BDL), a format developed and used by the Unisys Corporation.

The structural behavioral description representation 24 may be provided to other EDA software programs, including an optimization program. The circuit optimization tool may read the structural behavioral description representation 24 and optimize the logic represented therein. Typically, the optimization tool may read and write Electronic Data Interchange Format (EDIF) files. The EDIF format is an industry standard format for hardware design language information. Thus, embedded within a typical optimization tool is an EDIF reader and an EDIF writer. The EDIF writer and reader translate the circuit design database 20 from an internal format to and from the EDIF format. It is recognized that the EDIF reader and EDIF writer programs may have to be provided by the user, depending on the format of the internal circuit design database.

The optimization methodology used by the optimization tool may be selectable by the user. For example, the user may direct the optimization tool to optimize a particular portion of the circuit design such that power, area, speed or other predefined parameter is optimized. Further, the optimization program may optimize the structural behavioral description representation 24 using components from a selected cell library 30 or design library 32. The optimization program may provide an optimized structural behavioral description representation, as shown at 26. In the preferred embodiment, the optimization program is the Design Compiler, commercially available from Synopsys, Inc.

The optimized structural behavioral description representation 26 may then be placed and routed using a commercially available place and route tool. In the preferred embodiment, the place and route tool, Gate Ensemble, provided by Cadence Design Systems, Inc. is utilized, although other firms active in the electronic design automation (EDA) industry sell systems similar in function to the above-mentioned Cadence tool.

The result may be stored in the circuit design database 20 as a physical implementation representation 28. Typical cell libraries include a number of representations of each component therein including a symbol representation, a schematic representation and a physical representation. This is also true for components in the design library 32. The physical implementation representation 28 of the circuit design database 20 typically includes references to the physical representation of the library components referenced therein.

Figure 3:
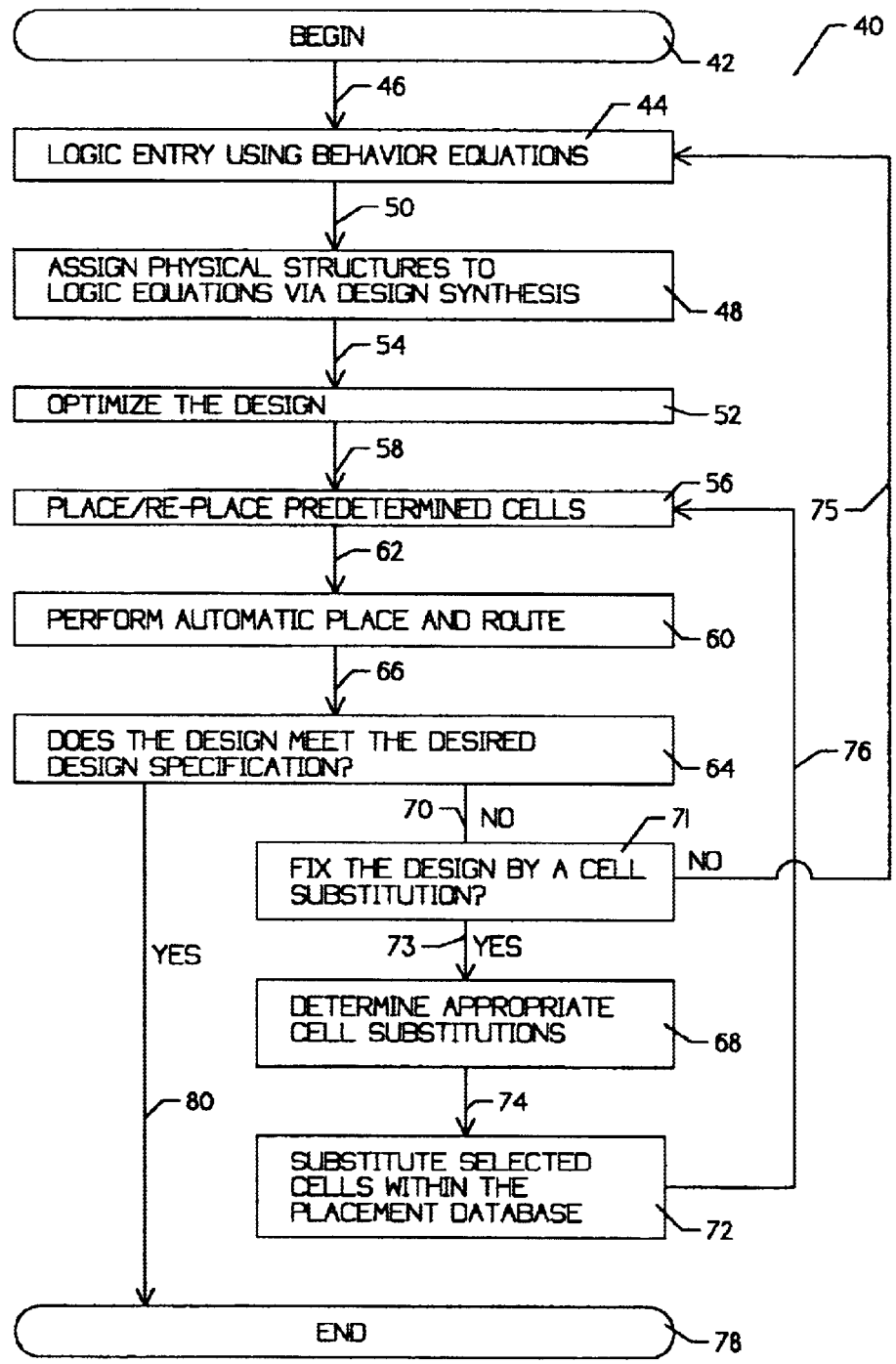
FIG. 3 is a flow diagram showing illustrative design steps in accordance with an exemplary embodiment of the present invention.

FIG. 3 is a flow diagram showing illustrative design steps in accordance with an exemplary embodiment of the present invention. The flow diagram is generally shown at 40 and is entered at element 42. Control is then passed to element 44 via interface 46. Element 44 allows a circuit designer to enter the logic of a circuit design using behavior equations. Control is then passed to element 48 via interface 50. Element 48 assigns physical structures to the logic equations via design synthesis. Control is then passed to element 52 via interface 54. Element 52 optimizes the circuit design. Control is then passed to element 56 via interface 58. Element 56 places predetermined cells within the circuit design. Control is then passed to element 60 via interface 62. Element 60, automatically places and routes the remainder of the circuit design. Control is then passed to element 64 via interface 66. Element 64 determines whether the design meets the desired design specification.

If the design does not meet the desired design specification, control is passed to element 71 via interface 70. Element 71 determines whether the design can likely be corrected by a cell substitution. If the design can likely be corrected by a cell substitution, control is passed to element 68 via interface 73. Element 68 determines appropriate cell substitutions. Control is then passed to element 72 via interface 74. Element 72 substitutes selected cells within the placement database. Control is then passed back to element 56 via interface 76, wherein predetermined cells are re-placed. Referring back to element 71, if the design cannot be corrected by a cell substitution, control is passed to element 44 via interface 75, wherein the logic equations are modified.

The loop comprising elements 56, 60, 64, 68 and 72, and potentially the loop comprising elements 44, 48, 52, 56, 60, 64 and 71, is repeated until the design meets the desired design specification. Once the design meets the desired design specification, control is passed from element 64 to element 78 via interface 80, wherein the algorithm is exited. It is recognized that the above-described design flow is only exemplary, and that variations thereof are contemplated.

Figure 4:
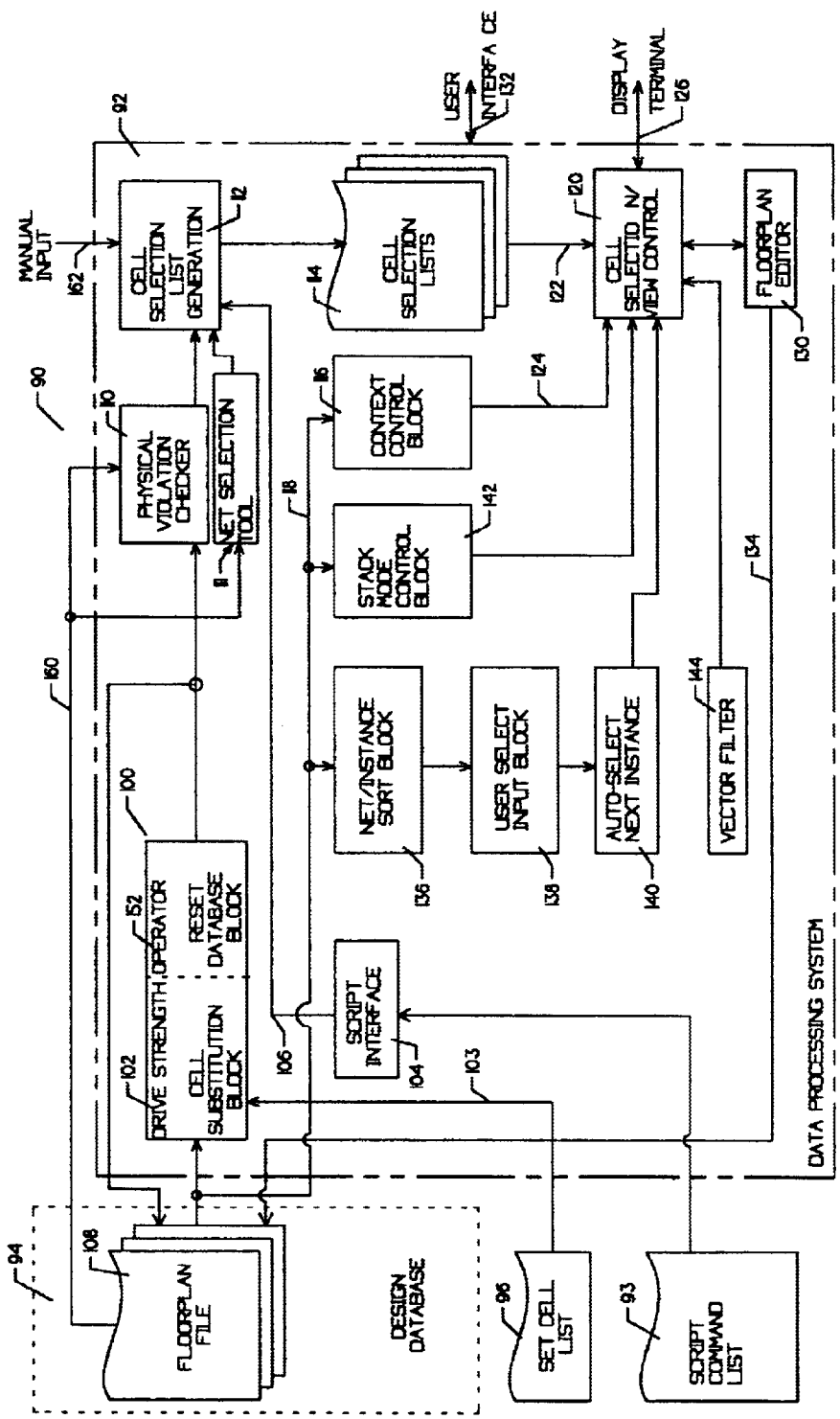
FIG. 4 is a block diagram of a data processing system for affecting placement of a circuit design database, in accordance with the present invention.

FIG. 4 is a block diagram of a data processing system 92 for affecting placement of a circuit design in accordance with the present invention. The diagram is generally shown at 90. The data processing system 92 is coupled to a design database 94, a set cell list 96, and a script interface list 93. The design database 94 may include a floorplan file 108. The floorplan file 108 is part of the design database 94, but may include the information and data related to the floorplan of the circuit design. In a preferred mode, the floorplan file is the only part of the design database 94 that is updated or changed during the floorplanning process.

The generation of the set cell list 96 is described in U.S. patent application Ser. No. 08/598,506, filed Feb. 7, 1996 entitled "Method and Apparatus for Performing Drive Strength Adjust Optimization in a Circuit Design" and U.S. patent application Ser. No. 08/597,931, filed Feb. 7, 1996 entitled "Method and Apparatus for Resolving Conflicts Between Cell Substitution Recommendations Provided by a Drive Strength Adjust Tool", both of which have been incorporated herein by reference. The set cell list 96 contains a list of desired cell substitutions.

The set cell list 96 may be provided to a drive strength operations block 100 via interface 103. Cell substitution block 102 may read the floorplan file 108, and may substitute the specified cells with predetermined cells having a different performance characteristic. In a preferred embodiment, the set cell list 96 identifies certain cells within the current floorplan file 108, and identifies a corresponding cell having a different drive strength for substitution.

After substitution, the cell substitution block 102 writes the results back to the floorplan file 108. A number of previous revisions of floorplan file 108 may be saved, as shown. The floorplan file 108 thus includes the cell substitutions provided by cell substitution block. Because the cell substitution block 102 may only replace the data object within the floorplan file 108, and may not modify the placement of adjacent cells, some of the replacement cells may, for example, overlap adjacent cells or otherwise violate predefined placement rules. This may be particularly true if the replacement cells are physically larger than the original cells. See, for example, U.S. patent application Ser. No. 08/598,506, filed Feb. 7, 1996 entitled "Method and Appa-ratus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

To detect physical violations caused by the cell substitution block 102, the floorplan file 108 may be provided to a physical violations checker block 110. The physical violations checker block 110 may detect predetermined physical violations in the floorplan file 108. The physical violations checker 110 may provide the detected physical violations to a cell selection list generation block 112. The cell selection list generation block 112 may generate a list of cells that are involved in the detected physical violations. This may be controlled, at least in part by script commands provided via interface 106. The resulting list of cells may be formatted into a cell selection list 114. It is contemplated that the cell selection list may also be provided by other input means including manual input interface 162, net selection tool 111, or directly from the script interface 104 via interface 106.

In a preferred embodiment, the cell selection list 114 is a list of cells that are to be sequentially selected by the data processing system, thereby enabling a user to manually correct the detected physical violations. Thus, the cell selection list 114 may be provided to a cell selection/view control block 120. The cell selection/view control block 120 may sequentially select and display each of the cells in the cell selection list 114.

The cell selection/view control block 120 may be coupled to a display terminal via interface 126 and to a floorplan editor 130. The display terminal is used to display the current cell and surrounding cells. In a preferred embodiment, the cell selection/view control block 120 selects the current cell from the cell selection list 114, and zooms in and displays the current cell on the display device. Thereafter, the user may use the floorplan editor 130 via interface 132 to edit the floorplan file to correct the detected physical violation. After each of the cells identified in the cell selection list 114 has been sequentially operated upon by the cell selection/view control block, the user may direct the floorplan editor to store the floorplan file via interface 134. The above design process is also described in U.S. patent application Ser. No. 08/789,024, filed Jan. 27, 1997, entitled "Method and Apparatus for Identifying Physical Errors in a Placement Database", and U.S. patent application Ser. No. 08/789,025, filed Jan. 27, 1997, entitled "Method and Apparatus for Efficiently Viewing a Number of Selected Components Using a Database Editor Tool".

The above method is extremely valuable, particularly since large number of errors may be detected by the physical violations checker block 110. In the past, a circuit designer typically manually located each violation by panning through the design in a floorplanning graphics window. Even when the exact location of a violation was known, navigating to that point could be slow, since the graphics terminal was often manipulating files containing tens of thousands of gates.

It is contemplated that the physical violations checker 110 may read the floorplan file 108 directly via interface 160. This may allow the physical violations checker 110 to detect violations in the floorplan file 108, without first performing a cell substitution. This may be particularly useful when the physical violations checker 110 can detect violations other than those caused by cell substitutions.

In some cases, a cell substitution may cause the performance of the design to decrease or otherwise not have the intended effect. Under these circumstances, it may be desirable to undo the cell substitutions made by cell substitution block 102, and revert back to the previous design iteration. A reset database block 152 may be provided to accomplish this task. The reset database block 152 may read the floorplan file 108, and may reset the floorplan file 108 back to a previous state. The set cell list 96 may then be exported and used by a drive strength adjust tool, as the basis for a new cell substitution. An exemplary drive strength adjust tool is discussed in U.S. patent application Ser. No. 08/598,506, filed on Feb. 7, 1996, and entitled "Method and Apparatus for Performing Drive Strength Adjust Optimization in a Circuit Design".

A number of features may be incorporated into the data processing system to aid in the placement of the design database 94. A context control block 116 may read the floorplan file 108 via interface 118, and may set the current context to a selected hierarchical level. A context is a level of hierarchy within the design database, and often corresponds to a region. The working environment of a corresponding floorplanning tool may be set to the current context. By setting the working environment in this manner, only those cells or regions at one level below the context are displayed in a physical window (for example, a physical window that displays all unplaced cells). This feature may allow a circuit designer to work on a selected portion of the design, without having to sift through the cells and regions that are outside of the current context.

In addition to the above, providing a context as the working environment may make the selection of cells or regions within the context easier, especially if two or more regions overlap. That is, in the present invention, the floorplanning tool may select only those cells and regions that are within the current context. Cells and interconnect outside the current context are still visible. In a preferred embodiment, this is accomplished by enabling only those cells that are associated with the selected context for selection by the floorplanning tool.

It has been recognized that the selection of a region within a floorplanning window can be difficult, particularly when one or more regions overlap. To overcome this limitation, the context control block 116 may include a feature for maneuvering through the circuit design hierarchy, selecting cells or regions, and setting the context accordingly. In a preferred embodiment, this is accomplished by using predetermined up and down hot-keys. This feature may allow a circuit designer to select a predetermined context by selecting a cell or region known to be in a predetermined context, and then hitting an up hot-key to select the predetermined context. This feature may also allow a circuit designer to set the current context to a context lower in the design hierarchy by hitting a down hot-key. Thus, the up and down hot-key feature may allow a circuit designer to easily change the current context to a different hierarchical level from within the floorplanning window.

In contrast to the above, and in prior art placement tools, changing and selecting contexts within the floorplanning window was tedious, especially if regions overlapped. That is, and as indicated above, prior art tools typically cycled through the various overlapping regions until the desired region was finally located by the circuit designer. This was often slow and tedious because the regions were often large, including thousands of gates, and the selection process could involve loading the context information into local memory.

It is contemplated that the data processing system 92 may further include a net/instance sort block 136, a user select block 138, and an auto-select next instance block 140. The net/instance sort block 136 may sort un-placed cells and regions by instance name, and display the results in a physical window. By sorting the un-placed cells in a predetermined way (e.g. by a corresponding net name or instance name), the circuit designer may more easily find a desired cell or region for placement.

In prior floorplanning tools, and as indicated above, when a context was loaded, all of the children cells appeared as a pseudo random list of names in a physical window. Since large contexts often contained thousands of instance names, the physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement.

A further advantage of the net/instance sort block 136 is that a circuit designer may more easily define object groups, thereby allowing user defined group operations to more readily be performed. For example, a circuit designer may place all drivers for a vectored net by first performing a net sort, and then placing the first component in the group and specifying a direction for further group placement. The floorplanning tool may then incorporate features that allow the circuit designer to place all remaining cells in the group automatically (see for example, U.S. patent application Ser. No. 08/789,028, filed Jan. 27, 1997, which has been incorporated herein by reference). In the past, this simple operation could require the circuit designer to manually find each instance name, either from some external printout or by panning through the unsorted list within a physical window, and individually place each object.

The user select input block 138 allows a circuit designer to select a desired cell or region from the sorted list of cells provided by net/instance sort block 136. Auto-select next instance block 140 automatically selects the next cell or region in the sorted list of cells, thus allowing the user to sequentially place the cells or regions one after another. It is recognized that this may be particularly useful for placing cells that drive or receive vectored nets.

The data processing system 92 may further include a stack mode control block 142. The stack mode control block 142 may read the design database 94 and detect which groups of cells or regions have been defined as a stack. In a preferred embodiment, the design database 94 includes information which identifies selected cells as belonging to a particular stack. Once the stacks are identified, the stack mode control block 142 may allow the user to perform group operations on the stack. For example, all cells in the stack may be moved by simply moving the stack. Further, all cells in the stack may be placed by placing a first one of the cells and indicating a placement direction and spacing for the remaining cells of the stack. The stack mode control block 142 may automatically place the remaining cells in the specified direction and at the specified spacing. The stack mode control block is more fully described in U.S. patent application Ser. No. 08/789,028, filed Jan. 27, 1997, entitled "Method and Apparatus for Associating Selected Circuit Instances and for Performing a Group Operation Thereon".

Finally, data processing system 92 may include a vector filter block 144. Vector filter block 144 may be coupled to the cell selection/view control block 120. Vector filter block 144 may allow a user to view only those vectored nets that are wider than a predetermined threshold, narrower than a predetermined threshold, or fall within a predetermined range. This may reduce the visual complexity of the circuit design on the display device, and may allow the circuit designer to more effectively analyze vectored net paths. A further discussion of the vector filter 144 can be found in U.S. patent application Ser. No. 08/789,027, filed Jan. 27, 1997, entitled "Method and Apparatus for Selectively Viewing Nets Within a Database Editor Tool".

Figure 5:
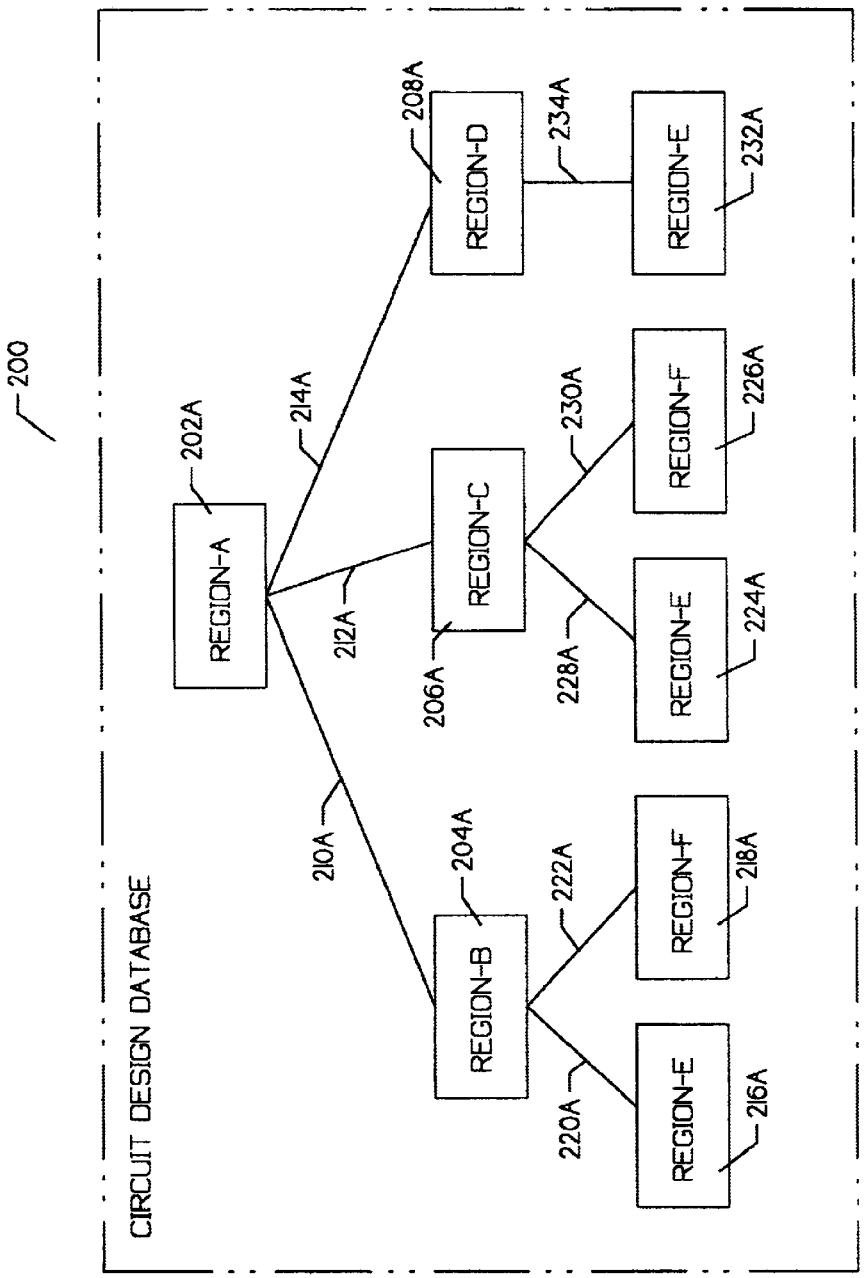
FIG. 5 is a block diagram showing a typical circuit design hierarchy, including a number of hierarchical circuit regions.

FIG. 5 is a block diagram showing a typical circuit design hierarchy, including a number of hierarchical circuit regions. The diagram is generally shown at 200. A top level region-A 202A is provided, and may represent the top hierarchical level in the exemplary circuit design database. Region-A 202A may include references to region-B 204A, region-C 206A, and region-D 208A as shown at 210A, 212A and 214A, respectively. Region-B 204A, region-C 206A, and region-D 208A represent the next lower level of design hierarchy in the circuit design database.

Region-B 204A may include references to region-E 216A and region-F 218A as shown at 220A and 222A, respectively. Similarly, region-C 206A may include references to region-E 224A and region-F 226A, as shown at 228A and 230A, respectively. Finally, region-D 208A may include a reference to region-E 232A, as shown at 234A. Regions 216A, 218A, 224A, 226A and 232A represent the lowest level in the design hierarchy of the circuit design database, and may be "leaf cells". That is, regions 216A, 218A, 224A, 226A and 232A may be components from a vendor provided cell library.

It is noted that the same region, for example region-E, may be referenced by region-B 204A, region-C 206A, and region-D 208A. To distinguish region-E 216A, region-E 224A and region-E 232A from one another, a unique instance name may be provided, thereby allowing each region to be uniquely identified. Similarly, region-F 218A and region-F 226A may be provided with a unique instance name.

It is recognized that in practice, the circuit design database is typically much more complex, containing many more levels of design hierarchy and thousands of regions and/or cells. That is, the circuit design database shown in FIG. 5 is only presented to illustrate the basic structure of a typical circuit design database.

Figure 6:
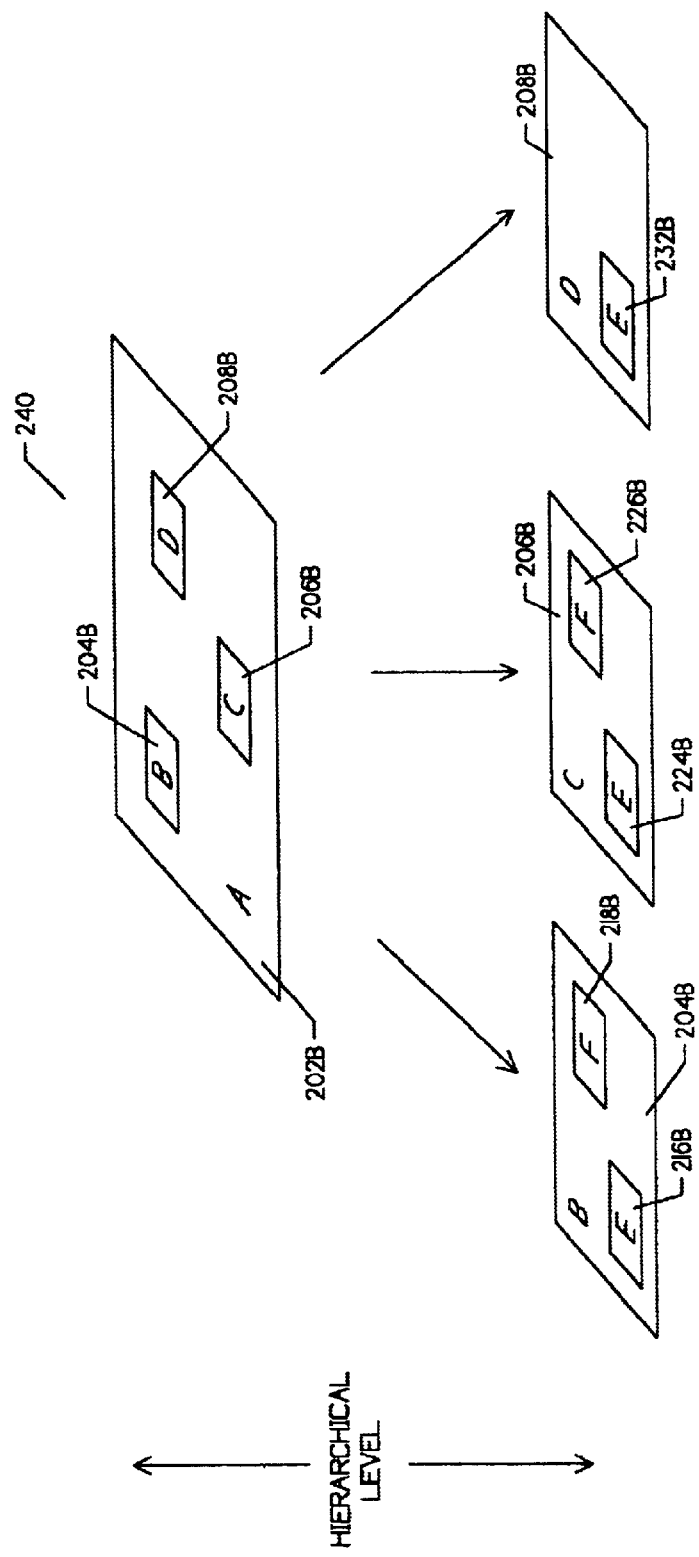
FIG. 6 is a block diagram showing a number of context environments for the circuit design hierarchy of FIG. 5.

FIG. 6 is a block diagram showing a number of context environments for the circuit design hierarchy of FIG. 5. As indicated above, the present invention contemplates allowing the circuit designer to set a "context" as the current working environment of the placement tool. Typically, the selected context corresponds to a region or cell within the circuit design database. For example, the circuit designer may elect to set the current context as corresponding to region-A 202B. In an exemplary embodiment, when the current context is set to a particular region, only those regions one level down in the design hierarchy are available for selection and placement. In this embodiment, only region-B 204B, region-C 206B and region-D 208B would be available for selection and placement.

Similarly, the circuit designer may elect to set the current context as corresponding to region-B 204B. As such, only region-E 216B and region-F 218B would be available for selection and placement. Setting the current context to region-C 206B may make only region-E 224B and region-F 226B available for selection and placement. Finally, setting the current context to region-D 208B may make only region-E 232B available for selection and placement. In this way, the environment of the placement program may conform to the particular level of hierarchy, or context, set by the circuit designer.

Figure 7A:
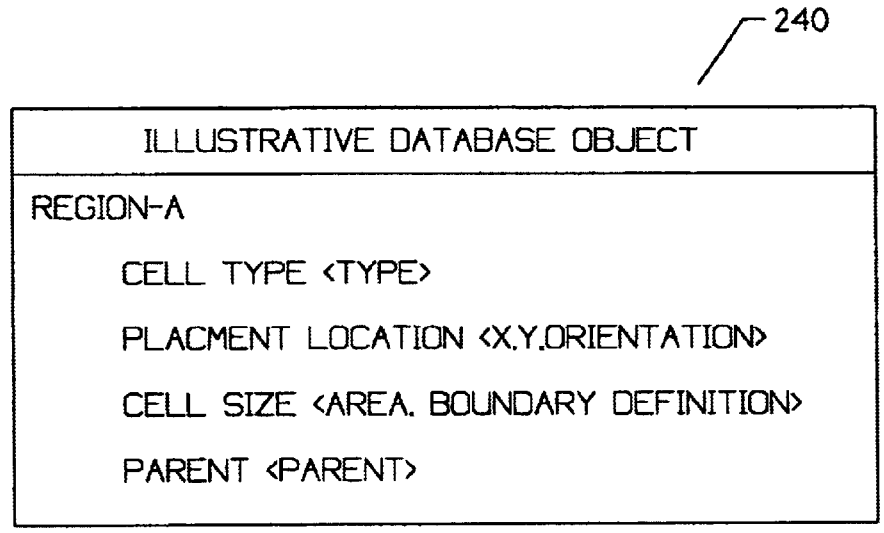
FIG. 7A is a table illustrating an object oriented data structure for Region-A of FIG. 5.

FIG. 7A is a table illustrating an object oriented data structure for Region-A of FIG. 5. In an illustrative embodiment, the circuit design database may be object oriented. That is, each cell or region may be included as a number of objects within the circuit design database. In the table of FIG. 7A, an illustrative database object for region-A is shown. The database object may be identified by a region name, for example, region-A as shown. This may be the instance name of the region. The database object may further include a number of objects that describe the object. For example, region-A may include a cell-type object which indicates the type of the cell (NAND2, OR2, REG, etc.). Region-A may further include a placement location object, including the X-Y coordinates and the placement orientation. In addition, region-A may include a cell size object, including the area of the region and the boundary definition. Finally, region-A may include a parent object, which may indicate the parent of region-A within the overall design hierarchy. It should be understood that the objects shown in FIG. 7A are only illustrative, and that in a typical design database, many more objects are stored for each region and/or cell.

Figure 7B:
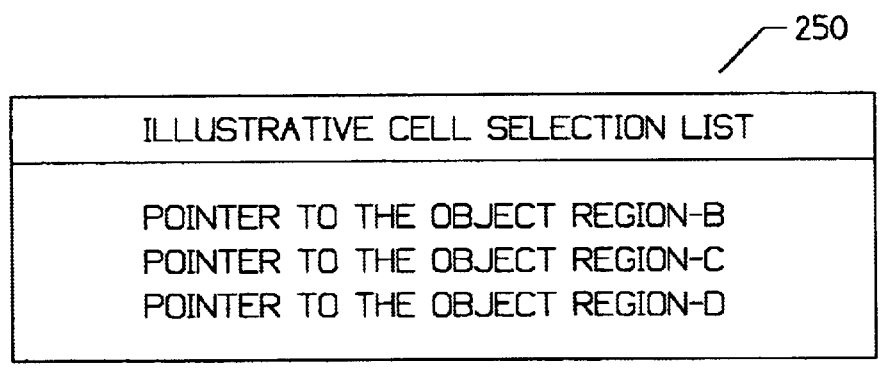
FIG. 7B is a table illustrating a cell selection list for Region-A of FIG. 5.

FIG. 7B is a table illustrating a cell selection list for Region-A of FIG. 5. Assuming that region-A of FIG. 5 corresponds to the current context, the placement tool may only allow those cells one level down in the design hierarchy to be selected. As such, the placement tool may query the design database objects and find all region or cells that have region-A as their parent (see FIG. 7A). Those cells may then be activated by the placement tool for selection. In the illustrative embodiment of FIG. 5, only region-B 204A, region-C 206A and region-D 208A would be available for selection. This is represented in FIG. 7B as a number of pointers, one pointer for each available region.

In a preferred embodiment, the current context may be set to any level of hierarchy in the circuit design database. It should be noted, however, that the context feature of the placement tool may be deactivated, such that any cell or region in the circuit design may be selected by the circuit designer, regardless of the context in which the cell or regions reside.

Figure 8:
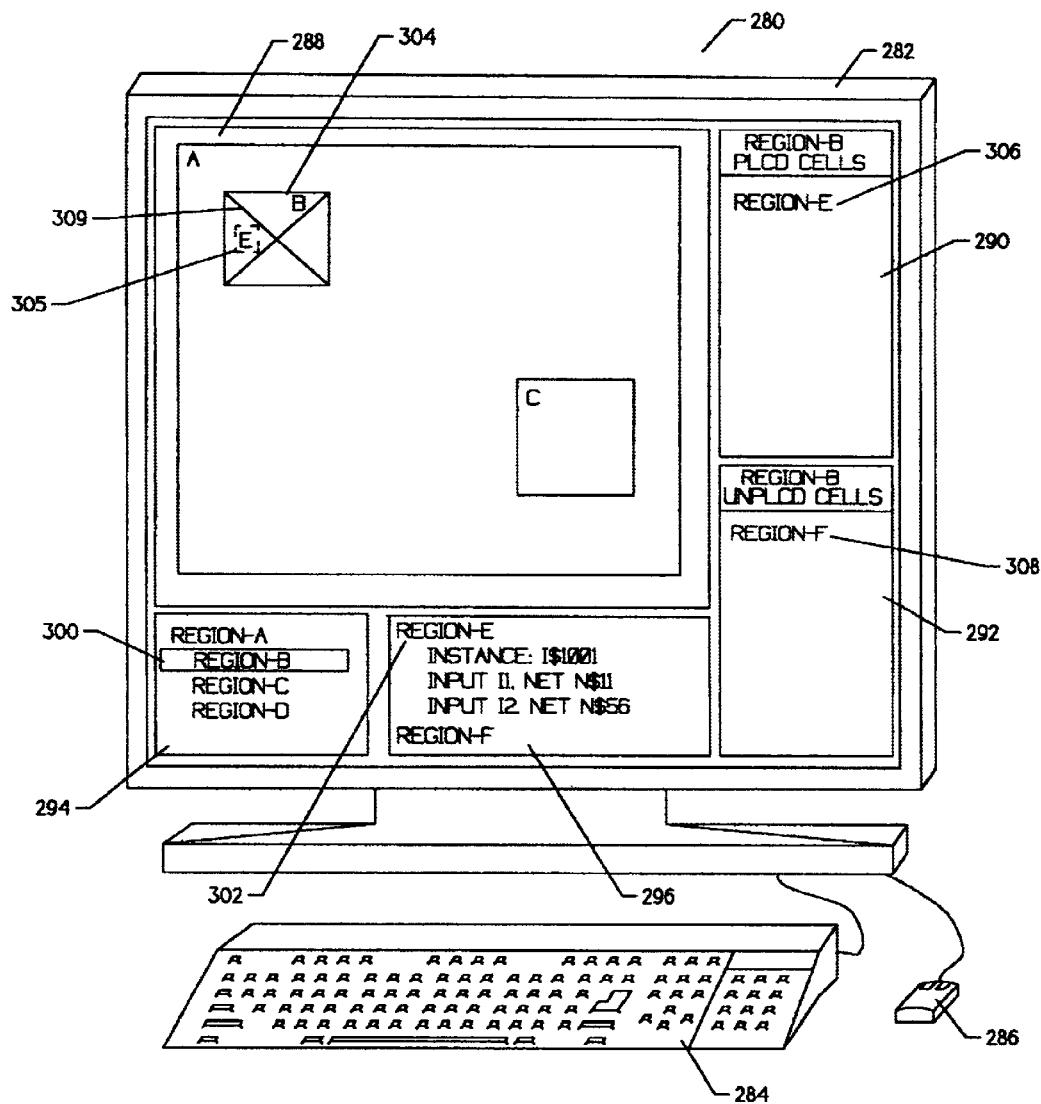
FIG. 8 is a block diagram of a data processing system executing a placement tool in accordance with the present invention.

FIG. 8 is a block diagram of a data processing system executing a placement tool in accordance with the present invention. In a preferred embodiment, the data processing system 280 may include a display device 282, a keyboard 284 and a pointing device 286. A microprocessor or the like may be included in the display device 282 or in a separate unit (not shown).

The data processing system 280 may incorporate a placement tool. The placement tool may be implemented in either hardware or software. In a preferred embodiment, the placement tool is implemented in software and executed on the data processing system 280.

A preferred embodiment of the placement tool displays a number of windows on the display device 282. These windows including a floorplanning window 288, two logical windows 294 and 296, and two physical windows 290 and 292. The floorplanning window displays a physical representation of the circuit design database, and in particular, displays those cells and/or regions that are placed on a scaled representation of an integrated circuit die.

A first logic window 294 may display a tree graph of the circuit design hierarchy. The circuit designer may scroll through the first logic window 294, and may identify particular regions therefrom. In the illustrative diagram, region-B has been identified, as shown at 300. In a preferred embodiment, only regions are displayed in the first logic window 294. Leaf cells are not displayed.

A second logic window 296 may display the leaf cells or regions within the region that is identified in the first logic window 294. For example, if region-B is identified in the first logic window 294 as shown at 300, the second logic window 296 may display the cells within region-B. In this case, the second logic window 296 displays region-E and region-F, as shown at 302. It is assumed for this example, that region-E and region-F are leaf cells, otherwise they would be displayed in the first logic window 294.

It is contemplated that the second logic window 296 may also display selected database objects for each of the cells or regions therein. Accordingly, the second logic window 296 may display the instance name, the input pin names along with the associated net names for each input pin, the output pin names along with the associated net names for each output pin name, etc. It is contemplated that any number of predefined database objects may be displayed for each of the cells within the second logic window 296.

In a preferred embodiment, the placement tool may allow the circuit designer to set the current context in any number of ways. A first method is to identify a region or cell in the first logic window 294 or the second logic window 296, and hit a predefined set context key. For example, the circuit designer may identify region-B in the first logical window 294, as shown at 300. The designer may then hit the predefined set context key to set the current context to region-B. When a region is set as the current context, the placement tool may provide an "X" over the selected region in the floorplanning window 288, as shown at 309. This provides a visual indication of the current context.

Another method for selecting a current context is to select a region in the floorplanning window, and then hit the predefined set context key. Yet another method is to select a region or cell from one of the physical windows (see below), and then hit the predefined set context key. In general, after any cell or region is selected or identified in any manner, the circuit-designer may set the current context to the selected cell or region by hitting the predefined set context key. It is recognized that the above-described methods for setting the current context are only exemplary, and that many other methods are contemplated.

A first physical window 292 may display all unplaced cells within the current context. Similarly, a second physical window 290 may display all placed cells within the current context. In a preferred embodiment, the current name of the region or cell that is set as the current context is displayed in the title bar of each of the first and second physical windows. In the illustrative embodiment shown in FIG. 8, region-B is set as the current context, and thus the title bar above the first and second physical windows displays the name "region-B", as shown.

The floorplanning window 288 displays a number of placed cells. In the present example, region-A, region-B, region-C, and region-E are displayed. For illustrative purposes, it is assumed that the placement tool is operating on the circuit design database shown in FIGS. 5–6. As indicated above, region-B is selected as the current context. Thus, the second logic window displays the cells therein, including leaf cells region-E 302 and region-F (partially shown), and selected database objects therefor.

Region-E is also displayed in the second physical window 290, as shown at 306, because region-E is already placed in the floorplanning window 288, as shown at 305. Region-F, on the other hand, is displayed in the first physical window 292, as shown at 308, because region-F remains unplaced in the floorplanning window 288.

During the placement of a circuit design database, the circuit designer may scroll through the first physical window 292 and set a selected region or cell as the current context (by hitting the predefined set context key). Once selected, the children of the selected region may be displayed in the first and second physical windows 290 and 292. The children of the selected region are referred to as the active regions and cells within the current context. The placed active regions and cells are displayed in the second physical window 290 and the unplaced active regions and cells are displayed in the first physical window 292. The circuit designer may then select an unplaced region or cell from the first physical window 292. The placement tool may then load a physical representation of the selected region or cell, and the circuit designer may place the physical representation of the region or cell in the floorplanning window 288. The placement tool may then move the region or cell from the first physical window 292 to the second physical window 290. The first and second logic windows 294 and 296 are updated when the selection is changed in the floorplanning window 288, the first physical window 292 or the second physical window 290.

It is recognized that the circuit design database may be much more complex and contain many more levels of hierarchy than that shown in the simple example of FIG. 8. In a typical circuit design database, large contexts often contain thousands of regions and/or cells, and thus the first and second physical windows typically display many more objects.

Figure 9:
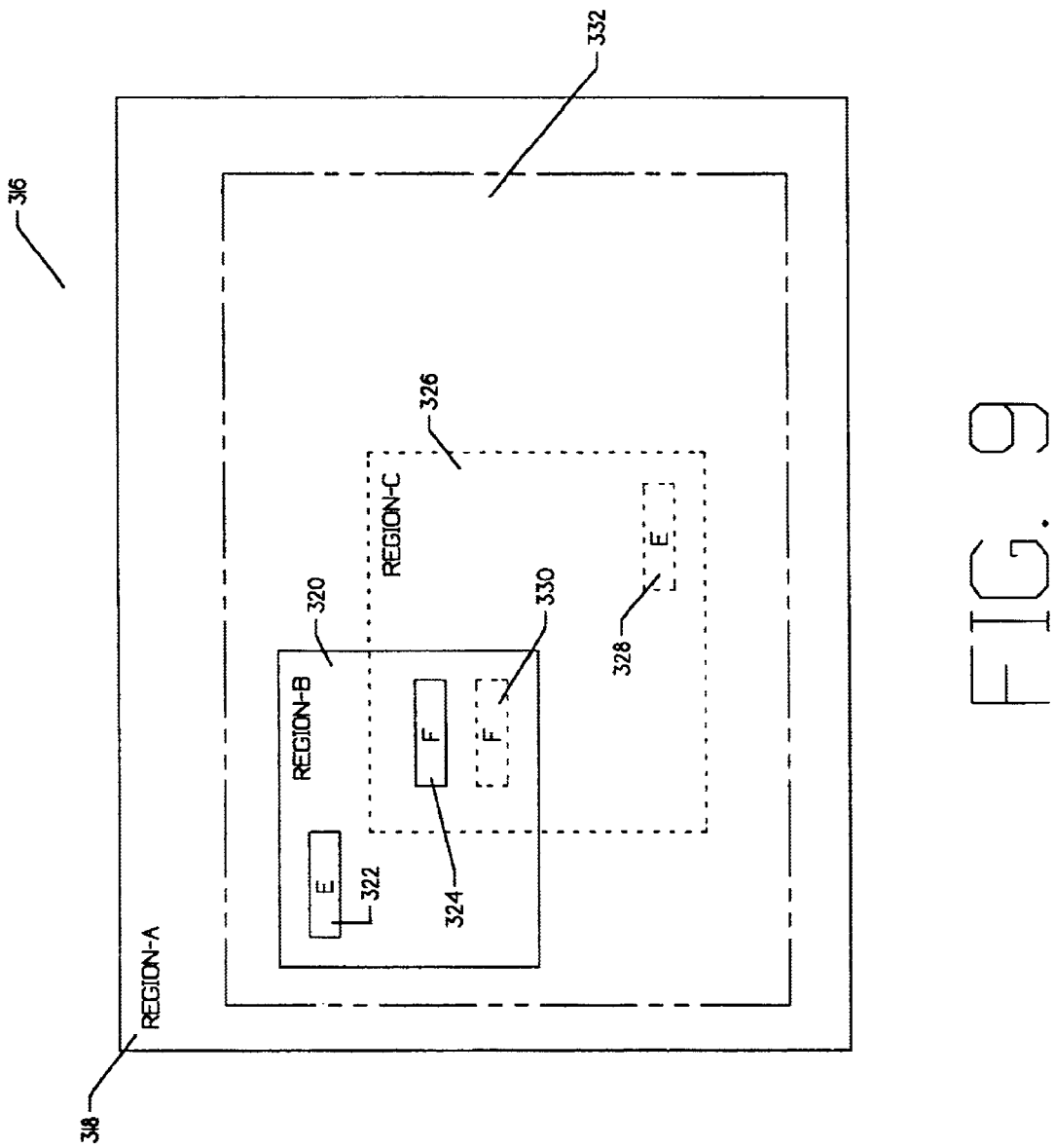
FIG. 9 illustrates a first cell selection method of the present invention.

FIG. 9 illustrates a first cell selection method of the present invention. The diagram is generally shown at 316 and shows an illustrative floorplanning window of a placement tool. As indicated in the BACKGROUND section above, some placement tools allow operations to be performed on a user-defined group of objects using a pointing device within the placement tool (for example, selecting all objects within a certain area on the display device). However, they do not allow groups to be defined based on logical levels of hierarchy. This provides a major limitation since many group operations are performed on a logical hierarchy basis. The ability to form groups based on the logical hierarchy can be particularly useful when multiple contexts overlap. In this situation, regions or cells within the overlapping contexts may be intermixed, and selecting only those regions or cells that correspond to a desired context can be difficult.

To overcome these limitations, the present invention contemplates a feature for selecting only those objects in the current context. As indicated above, this feature may be particularly useful when multiple contexts overlap. In a preferred embodiment, this is accomplished by allowing only those cells that are associated with the current context to be selected by the placement tool.

Referring specifically to FIG. 9, a number of regions are placed including region-A 318, region-B 320, and region-C 326. In addition, region-B includes placed region-E 322 and region-F 324. Finally, region-C includes placed region-E 328 and region-F 330. It should be recognized that region-B 320 and region-C 326 overlap one another such that region-F 324 and region-F 330 are physically located within the boundaries of both region-B 320 and region-C 326.

In prior art placement tools, it could be difficult to perform a group operation on only those cells and regions associated with region-B 320. Prior art placement tools typically required the circuit designer to select a rectangular area using a pointing device. Everything within that rectangular area was selected and edited according to the group operation. In the present example, if a circuit designer selected a rectangular area around region-B 320, region-F 330 of region-C 326 would be selected and included in the group operation. However, this is often not the intended result because many group operations are performed on a logical hierarchy basis.

To overcome this limitation, the present invention contemplates a feature for selecting only those objects in the current context. That is, region-B is first selected as the current context, and all children within the current context are enabled for selection. Thereafter, when the circuit designer selects a desired rectangular area, for example a rectangular area 332, the placement tool only selects those cells that fall within the rectangular area, and are enabled for selection by the placement tool. In the example shown, only region-E 322 and region-F 324 would be selected, and included in the subsequent group operation. This may allow group operations to be performed on a logical hierarchy basis.

Figure 10:
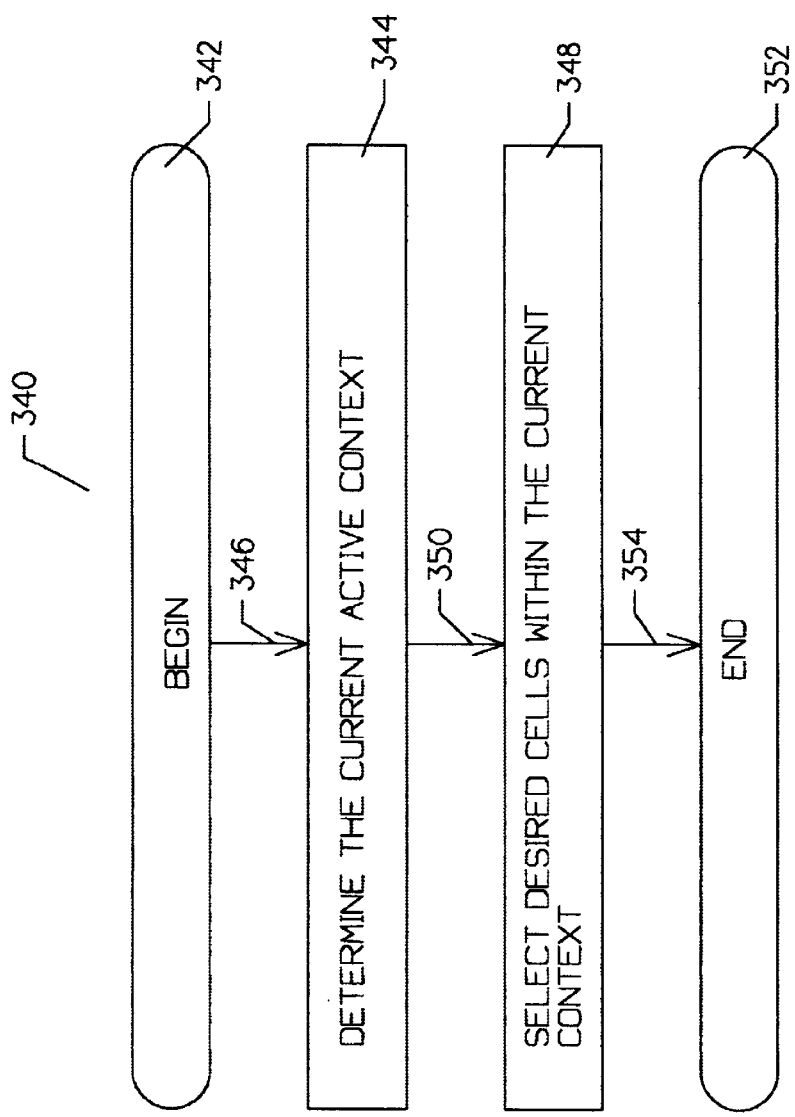
FIG. 10 and FIG. 11 are flow diagrams illustrating the first selection method of FIG. 9.

FIG. 10 is a first flow diagram illustrating the first selection method of FIG. 9. The flow diagram is generally shown at 340, and is entered at element 342. Control is passed to element 344 via interface 346. Element 344 determines the current active context. Control is then passed to element 348 via interface 350. Element 348 selects the desired cells within the current context. Control is then passed to element 352 via interface 354, wherein the algorithm is exited.

Figure 11:
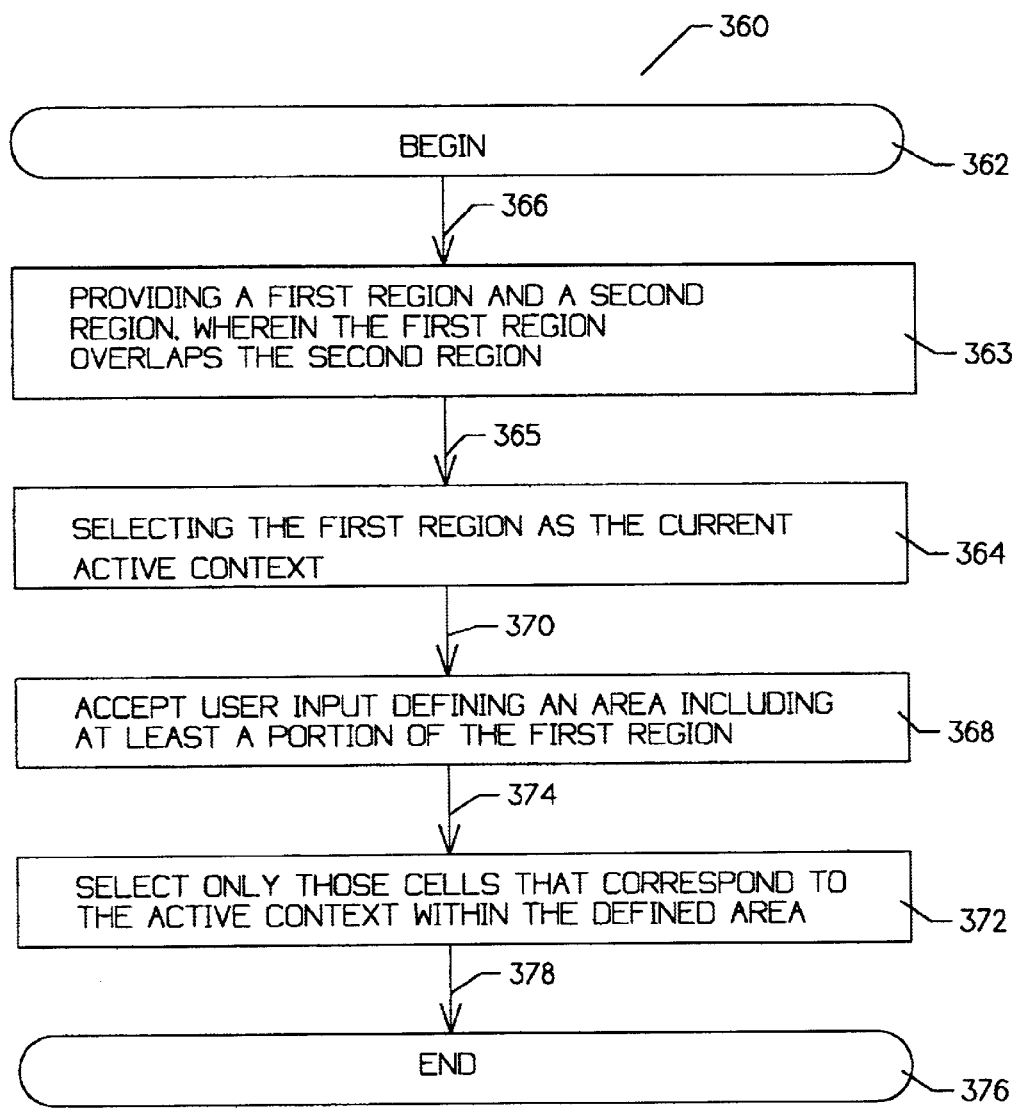

FIG. 11 is a second flow diagram illustrating the first selection method discussed in FIG. 9. The flow diagram is generally shown at 360, and is entered at element 362. Control is passed to element 363 via interface 366. Element 363 provides a first region and a second region, wherein the first region overlaps the second region. Control is then passed to element 364 via interface 365. Element 364 selects the first region as the current active context. Control is then passed to element 368 via interface 370. Element 368 accepts user input defining an area including at least a portion of the first region. Control is then passed to element 372 via interface 374. Element 372 selects only those cells that correspond to the current active context, and are within the defined area. Control is then passed to element 376 via interface 378, wherein the algorithm is exited.

Figure 12:
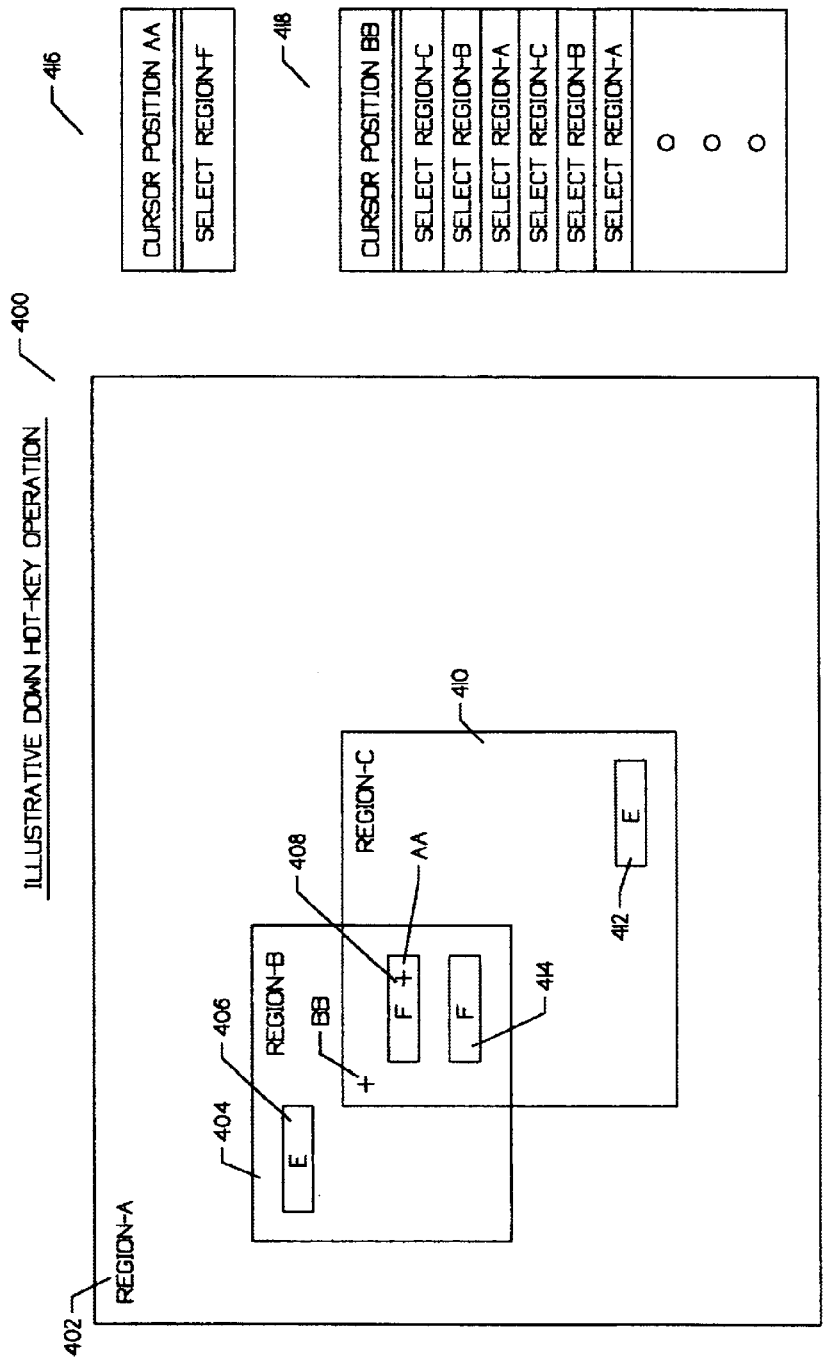
FIG. 12 illustrates a second cell selection method using a down hot-key in accordance with the present invention.

FIG. 12 illustrates a second cell selection method using a down hot-key in accordance with the present invention. A floorplanning placement window is generally shown at 400. As indicated in the BACKGROUND section above, changing and selecting contexts within the floorplanning window of prior art placement tools was often tedious, especially if regions overlapped. To set the current context to a selected level in the circuit design hierarchy, a circuit designer would typically position the cursor using a pointing device within a boundary of a desired context, and hit a selection key. Because prior art placement tools typically do not understand the logical hierarchy of the circuit design database, the placement tool typically cycled through the various overlapping cells and/or regions until the desired region or cell was finally located by the circuit designer. This was a slow and tedious process because the regions could be large, and could include thousands of regions and/or cells, and could be overlapping.

To overcome the above limitations, the present invention provides a feature for maneuvering through the circuit design hierarchy, and selecting cells or regions by using predetermined up and down hot-keys. In a first embodiment, and with reference to FIG. 12, a circuit designer may select a leaf cell by placing the cursor over the leaf cell and hitting a down hot-key. The leaf cell is selected regardless of whether there are overlapping regions at the selected cursor location. If the cursor is not positioned over a leaf cell, the placement tool may cycle through the overlapping regions until the desired region is selected.

In the specific example, if the cursor is positioned within the boundary of region-F 408, as shown at AA, the placement tool may select region-F 408. It is assumed for this example that region-F 408 is a leaf cell. If, however, the cursor is positioned at a location that does not overlap a leaf cell, for example at location BB, the placement tool may sequentially cycle through all of the regions that overlap at that location. In the illustrative diagram, this may including region-C 410, region-B 404 and region-A 402, and is illustrated in the table shown at 418.

Figure 13:
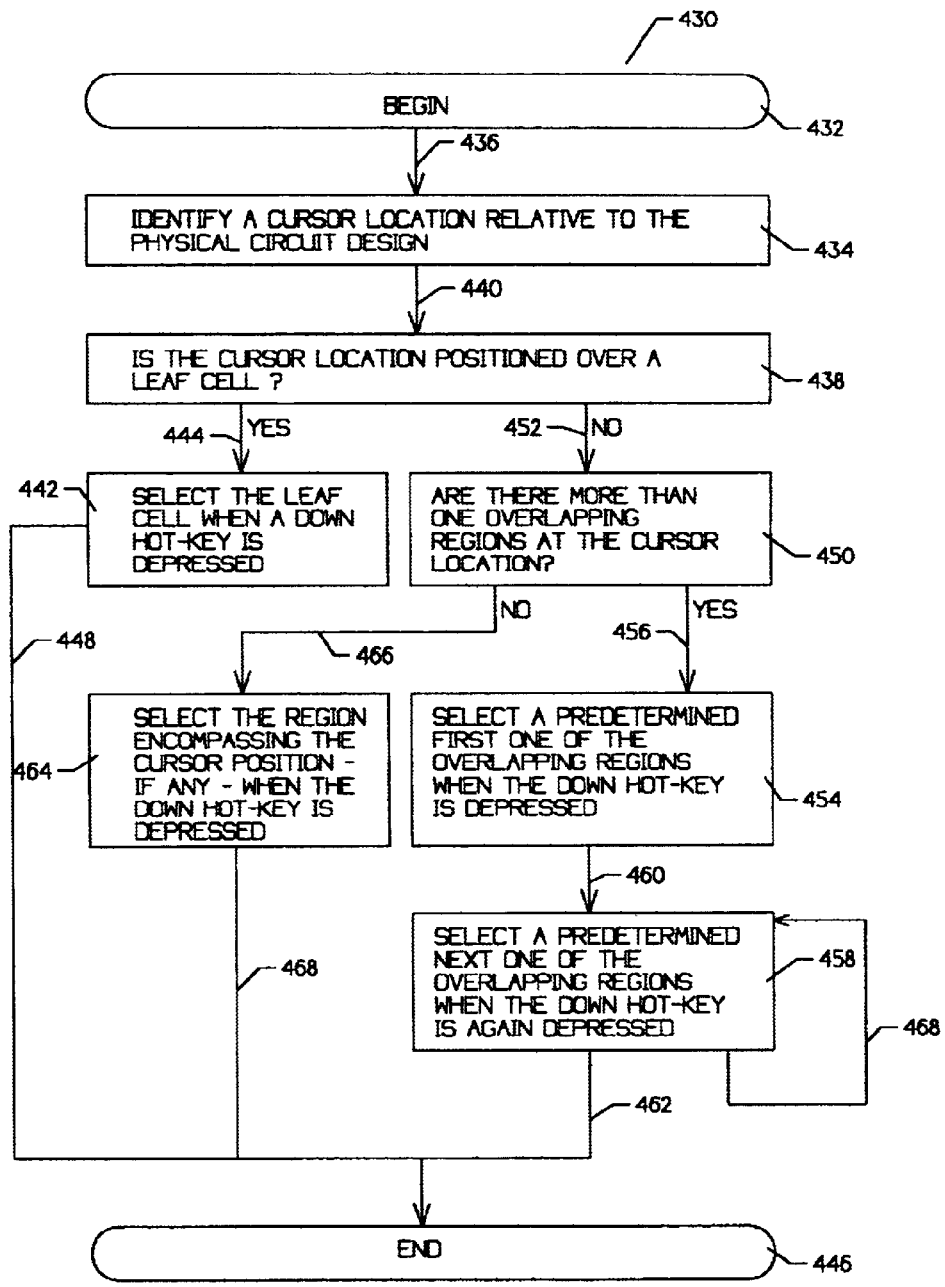
FIG. 13 is a flow diagram illustrating a preferred method for selecting cells using a down hot-key.

FIG. 13 is a flow diagram illustrating a preferred method for selecting cells using a down hot-key. The algorithm is generally shown at 430, and entered at element 432. Control is passed to element 434 via interface 436. Element 434 identifies a cursor location relative to the physical circuit design. Control is then passed to element 438 via interface 440. Element 438 determines whether the cursor location is positioned over a leaf cell. If the cursor location is positioned over a leaf cell, control is passed to element 442 via interface 444. Element 442 selects the leaf cell when a down hot-key is depressed. Control is then passed to element 446 via interface 448, wherein the algorithm is exited.

Referring back to element 438, if the cursor location is not positioned over a leaf cell, control is passed to element 450 via interface 452. Element 450 determines whether there are more than one overlapping regions at the cursor location. If there are not more than one overlapping regions at the cursor location, control is passed to element 464 via interface 466. Element 464 selects the region encompassing the cursor location, if any, when a down hot-key is depressed. Control is then passed to element 446 via interface 468, wherein the algorithm is exited.

Referring back to element 450, if there are more than one overlapping regions at the cursor location, control is passed to element 454 via interface 456. Element 454 selects a predetermined first one of the overlapping regions when a down hot-key is depressed. Control is then passed to element 458 via interface 460. Element 458 selects a predetermined next one of the overlapping regions when the down hot-key is again depressed. Control is then passed back to element 458 via interface 468. Any movement of the cursor or any key other than a hot down key causes a exit of the algorithm at 446. Exiting the algorithm would cause the algorithm appropriate to the key pressed to be entered.

Figure 14:
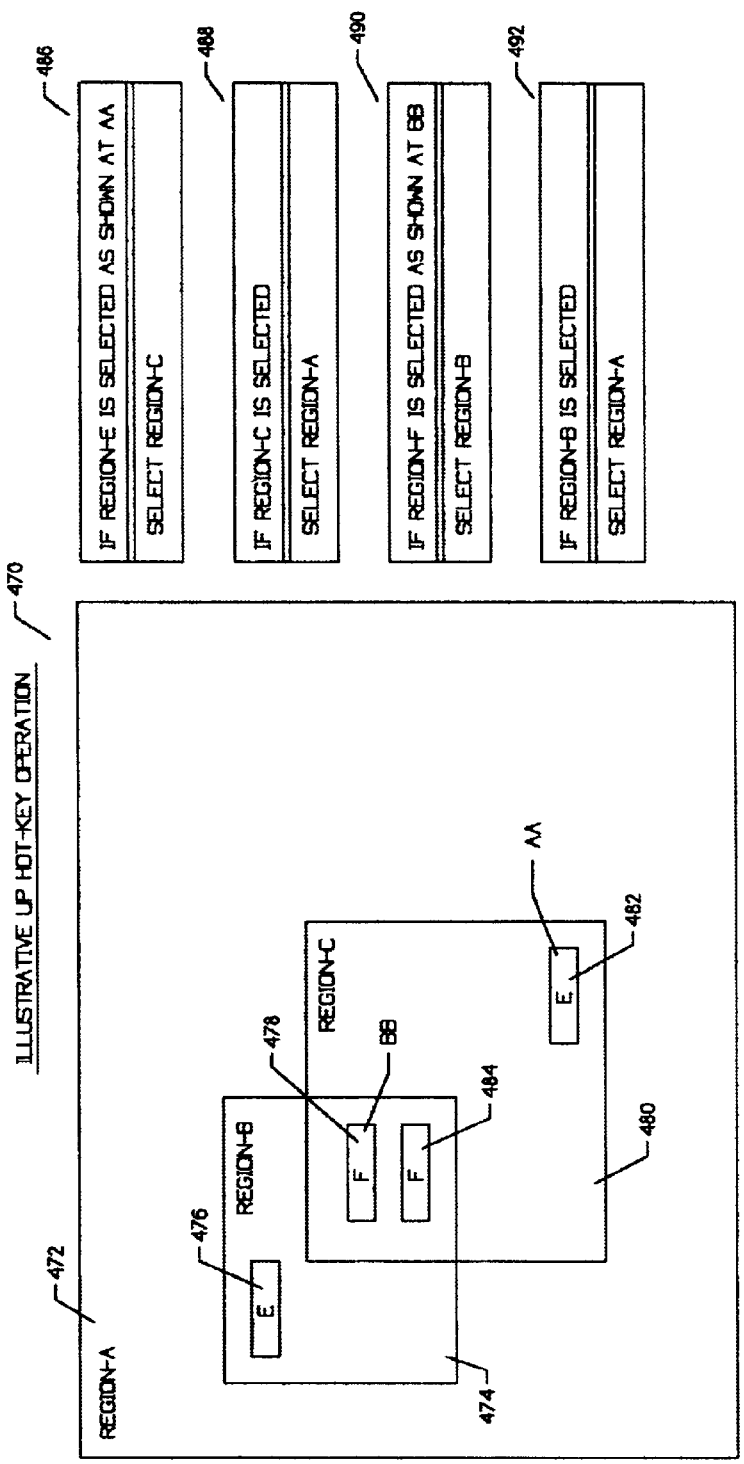
FIG. 14 illustrates a third cell selection method using an up hot-key in accordance with the present invention.

FIG. 14 illustrates a third cell selection method using an up hot-key in accordance with the present invention. A floorplanning placement window is generally shown at 470. As indicated in the BACKGROUND section above, changing and selecting contexts within the floorplanning window of prior art placement tools was often tedious, especially if regions overlapped. To set the current context to a selected level in the circuit design hierarchy, a circuit designer would typically position the cursor using a pointing device within a boundary of a desired context, and hit a selection key. Because prior art placement tools typically do not understand the logical hierarchy of the circuit design database, the placement tool cycled through the various overlapping cells and/or regions until the desired region or cell was finally located by the circuit designer. This was a slow and tedious process because the regions may be large, and may include thousands of regions and/or cells.

To overcome the above limitations, the present invention provides a feature for maneuvering through the circuit design hierarchy, and selecting cells or regions by using predetermined up and down hot-keys. The operation of the down hot-key feature is discussed with reference to FIGS. 12–13. A circuit designer may select a leaf cell by placing the cursor over the leaf cell and hitting a down hot-key. The leaf cell is selected regardless of whether there are overlapping regions at the selected cursor location. If the cursor is not positioned over a leaf cell, the placement tool may cycle through the overlapping regions until the desired region is selected.

Once a region or cell is selected by either using the down hot-key feature described above or some other method, a predefined up hot-key may be depressed, causing the placement tool to select the region containing the selected region or cell. That is, the up hot-key selects the parent of the selected region.

Referring specifically to FIG. 14, if region-E 482 is selected as shown at AA, the circuit designer may depress the predefined up hot-key to select the region that contains region-E 482, or in this case region-C 480. This is shown in the table shown at 486. Similarly, if region-C 480 is selected, the circuit designer may depress the predefined up hot-key to select the region that contains region-C 480, or in this case region-A 472. This is shown in the table shown at 488. Finally, if region-F 478 is selected, the circuit designer may depress the predefined up hot-key to select the region that contains region-F 478, or in this case region-B 474. Region-C 480 would not be selected since region-F 478 is not a logical child of region-C 480. This is shown in the table shown at 490.

In a preferred embodiment, the down hot-key feature described with reference to FIG. 12 and the up hot-key feature may be used in combination to maneuver efficiently through the circuit design hierarchy, and select cells or regions therein. For example, a circuit designer may select a predetermined context by: (1) selecting a cell that the circuit designer knows is within the predetermined context by hitting a predetermined down hot-key; and (2) hitting an up hot-key to select the predetermined context. In a preferred embodiment, the up hot-key may only select the region that is one level above the selected cell, and not set the current context. Thus, the circuit designer may have to hit a predefined set context key to set the current context to that region. This may be beneficial because cell selections can be made using the up and down hot-keys, as described above, without changing the current context. This up and down hot-key feature may allow a circuit designer to easily change the current context to a different hierarchical level within the circuit design within the floorplanning window.

Figure 15:
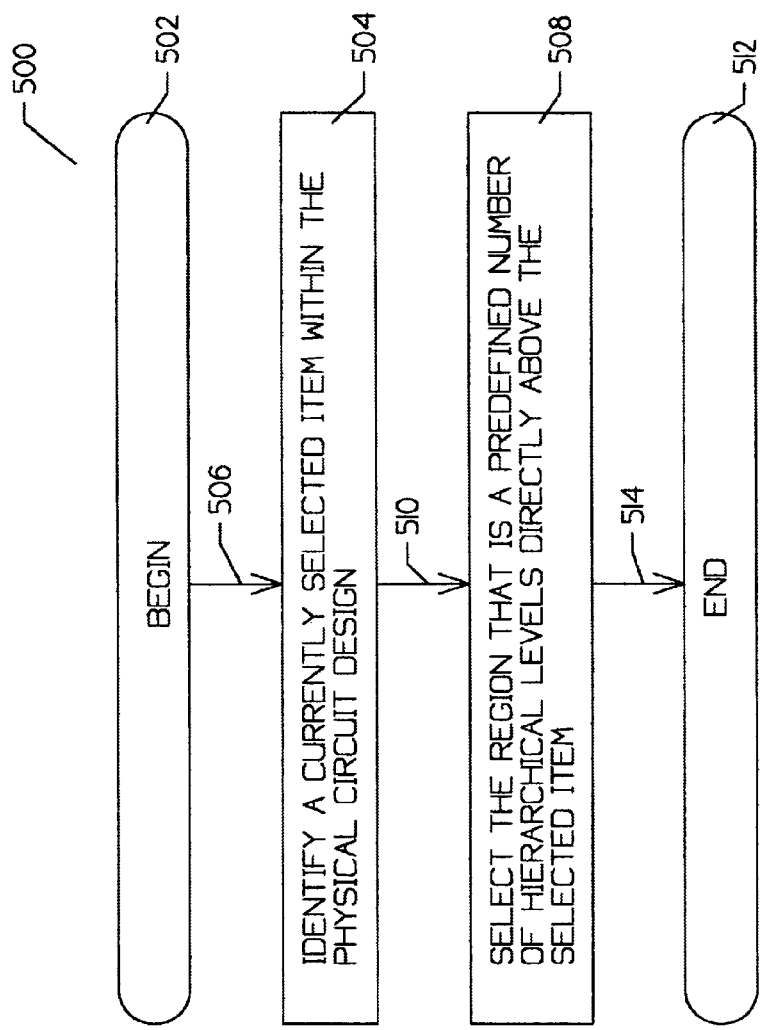
FIG. 15 is a flow diagram illustrating a preferred method for selecting cells using the up and down hot-keys of FIGS. 12–14.

FIG. 15 is a flow diagram illustrating a preferred method for selecting cells using the up and down hot-keys of FIGS. 12–14. The algorithm is generally shown at 500, and is entered at element 502. Control is passed to element 504 via interface 506. Element 504 identifies a currently selected item within the physical circuit design. The currently selected item may be selected using the down hot-key described with reference to FIGS. 12–14. Control is then passed to element 508 via interface 510. Element 508 selects the region that is a predetermined number of hierarchical levels directly above the selected item. This may be accomplished using the up hot-key feature described with reference to FIG. 14. Control is then passed to element 512 via interface 514, wherein the algorithm is exited.

Figure 16:
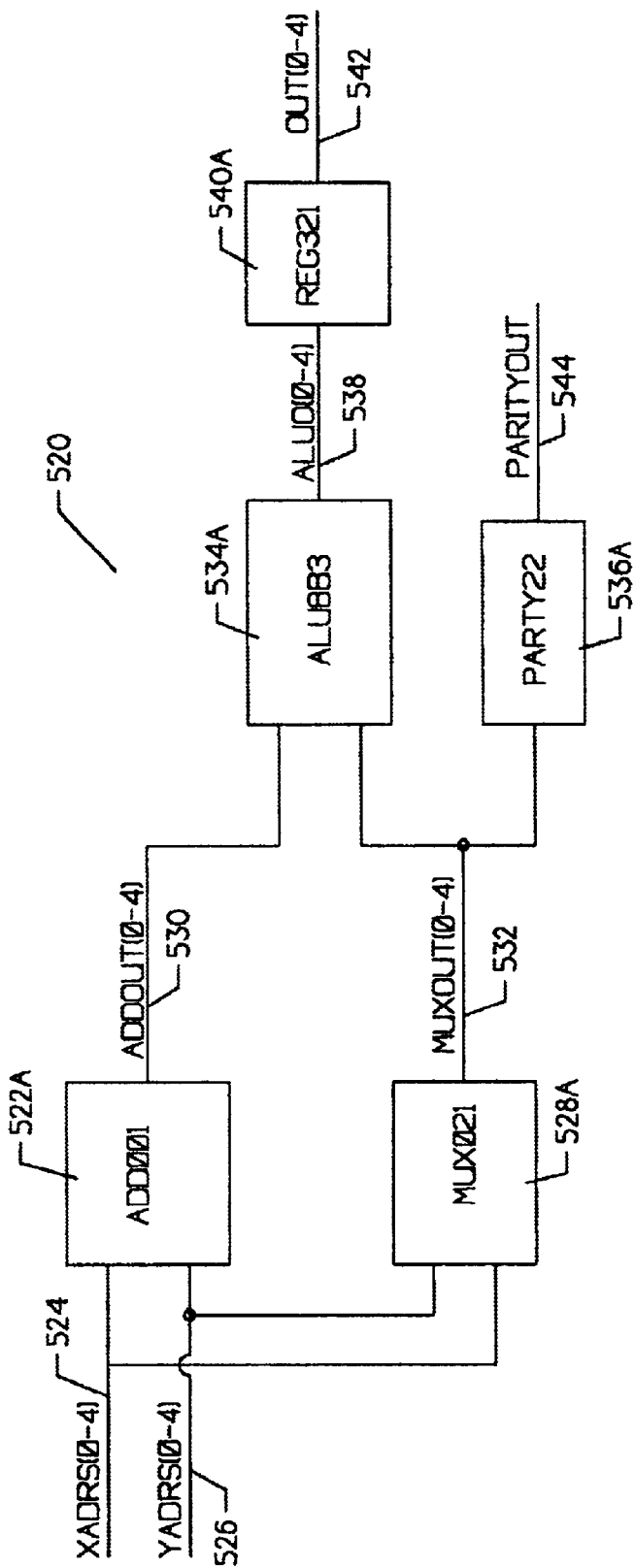
FIG. 16 is a schematic diagram showing a typical circuit design having vectored nets therein.

FIG. 16 is a schematic diagram showing a typical circuit design having vectored nets therein. Another feature of the present invention includes sorting the un-placed cells and regions by instance name, and manually selecting a desired cell or region from the resulting sorted list. In prior placement tools, and as indicated above, when a context was loaded, the children cells appeared as a random list of names in the un-placed physical window. Since large contexts often contain thousands of regions or cells, the un-placed physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement. Largely because of this tedious process, very little manual placement was performed.

In the present invention, the regions and/or cells associated with a context can be sorted by instance name. This provides a readily understood order to the list of regions and/or cells, thus enabling the circuit designer to quickly identify a desired object.

The illustrative circuit design of FIG. 16 includes a number of regions and cells including ADD001 522A, MUX021 528A, ALU883 534A, REG321 540A and PARTY22 536A. XADRS(0–4) 524 and YADRS(0–4) 526 are provided as inputs to ADD001 522A and MUX021 528A. ADD001 522A provides ADDOUT(0–4) 530 to an input of ALU883 534A. MUX021 528A provides MUXOUT(0–4) 532 to the an input of ALU883 534A and PARTY22 536A. ALU883 provides ALUO(0–4) 538 to REG321 540A. REG321 540A provides OUT(0–4) 542 as an output and PARTY22 536A provides PARITYOUT 544 as an output.

FIG. 17A is a table showing an illustrative unsorted un-placed physical window of a placement tool for the circuit design shown in FIG. 16. The table is generally shown at 550. The table includes an unsorted listing of the instance names in the first column 551, the net names associated with the first input in the second column 552, the net names associated with the second input in the third column 554 and the net names associated with the output in the fourth column 556.

FIG. 17B is a table showing an illustrative sorted un-placed physical window of a placement tool for the circuit design shown in FIG. 16, wherein the objects are sorted by instance name. The table is generally shown at 560, and shows the instance names in the first column 561 sorted alphabetically. The sorting feature may provide a predetermined order to the instance names shown in the un-placed physical window, thereby allowing the circuit designer to easily identify a particular instance for placement.

The illustrative circuit design shown in FIG. 16 has been kept relatively simple to more clearly illustrate the above sorting feature. It should be recognized, however, that typical circuit designs may be much more complex and may contain thousands of regions or cells within the un-placed physical window.

Figure 18:
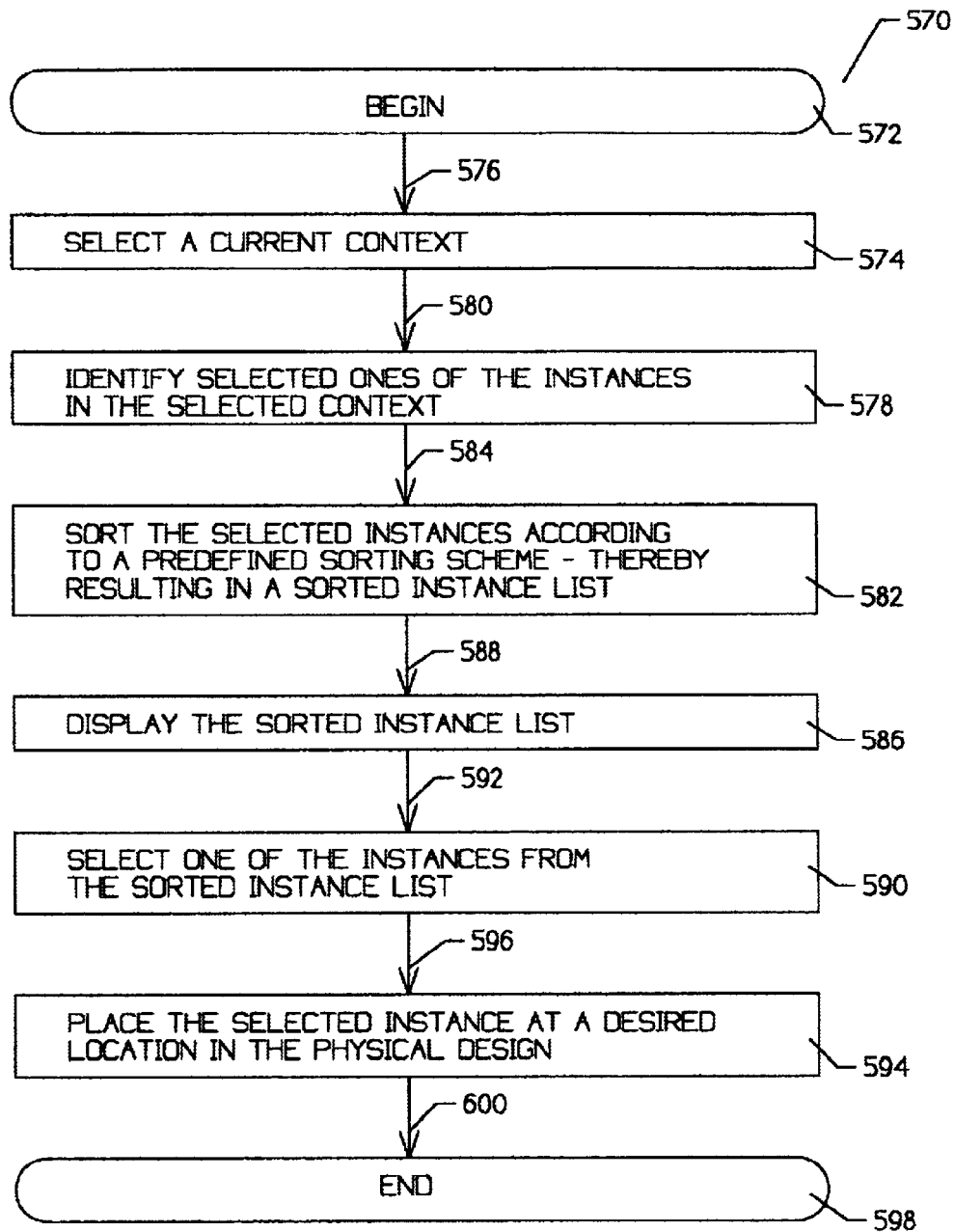
FIG. 18 is a flow diagram showing a fourth cell selection method, including the step of sorting selected instances prior to cell selection.

FIG. 18 is a flow diagram showing a fourth cell selection method, including the step of sorting selected instances prior to cell selection. The algorithm is generally shown at 570, and is entered at element 572. Control is passed to element

574 via interface 576. Element 574 selects a current context. Control is then passed to element 578 via interface 580. Element 578 identifies selected ones of the instances in the selected context. Control is then passed to element 582 via interface 584. Element 582 sorts the selected instances according to a predetermined sorting scheme, thereby resulting in a sorted instance list. Control is then passed to element 586 via interface 588. Element 586 displays the sorted instance list. Control is then passed to element 590 via interface 592. Element 590 selects one of the instances from the sorted instance list. Control is then passed to element 594 via interface 596. Element 594 waits for the user to specify a location by either a mouse or key press. When this occurs, the selected element is placed at the corresponding location. When this occurs or any other key is pressed, control is then passed to element 598 via interface 600, wherein the algorithm is exited.

Figure 19:
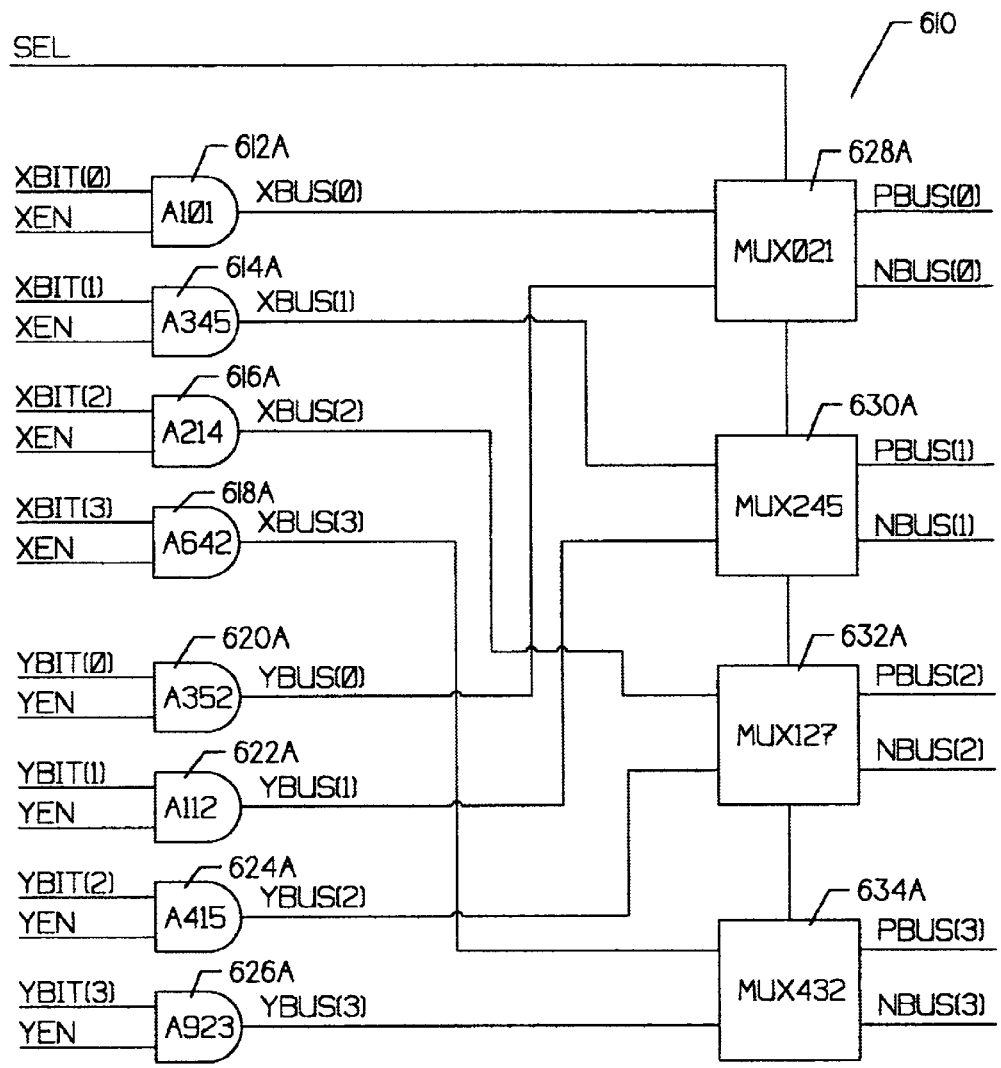
FIG. 19 is a schematic diagram showing another typical circuit design having vectored nets therein.

FIG. 19 is a schematic diagram showing another typical circuit design having vectored nets therein. Another feature of the present invention includes sorting the un-placed cells in regions by a corresponding net name. All of the un-placed regions and cells are typically connected to at least one net within the circuit design. For example, each of the un-placed regions and cells typically have an output which is connected to a net. If the circuit design is generated by a synthesis tool, as described above, some of the net names will have computer generated names. However, many synthesis tools retain the net names defined in the high level behavioral description of the circuit design, particularly for vectored nets and the like. Typically, the net names for each bit in a vectored net have the same net name with a bit number associated therewith. Thus, by sorting the instances by, for example, the net names associated with a corresponding output, a circuit designer may easily place all regions and cells associated with a vectored net. For example, all drivers of a vectored net may be sequentially listed in the un-placed physical window, because each net name is the same, thereby allowing each instance to be easily placed in the floorplanning window.

Referring specifically to FIG. 19, the illustrative circuit design includes a number of instances that drive the bus XBUS (0–3). These include AND gates 612A, 614A, 616A, and 618A. Similarly, the illustrative circuit design includes a number of instances that drive a bus named YBUS (0–4). This includes instances 620A, 622A, 624A, and 626A. Corresponding bits of the XBUS and YBUS are provided to a multiplexer. For example, XBUS (0) and YBUS (0) are provided to multiplexer 628A. Similarly, XBUS (1) and YBUS (1) are provided to multiplexer 630A. Multiplexer 628A, 630A, 632A and 634A then provide the corresponding bits for buses PBUS (0–3) and NBUS (0–3).

FIG. 20A is a table showing an illustrative unsorted un-placed physical window of a placement tool for the circuit design shown in FIG. 19. The table is generally shown at 650, and includes a first column 651 identifying each of the instance names shown in the circuit design of FIG. 19, a second column 652 identifying the net name associated with a first input of each of the corresponding instances, a third column 654 for identifying the net name associated with a second input of each of the corresponding instances, a fourth column 656 for identifying the net name associated with a first output of each of the corresponding instances, and a fifth column 658 for identifying the net name associated with a second output of each of the corresponding instances.

As can readily be seen, all of the un-placed objects are typically connected to at least one net within the design. Further, the instance names are typically computer generated by a synthesis tool, and thus may not readily identify the function or location of each instance within the circuit design. Thus, an unsorted list of un-placed cells, as shown in FIG. 20A, may not provide much benefit to the circuit designer, particularly if thousands of regions and/or cells are displayed therein.

In addition to the above, it is often desirable to place all instances that drive a particular vectored net. For example, a circuit designer may want to place all drivers of a vectored net in an abutting relation to maximize performance of the design and minimize the use of routing channels. With prior art placement tools, the circuit designer would typically examine an externally generated listing to identify the computer generated instance name associated with the driver of a first bit of the selected vectored net. The circuit designer would then scroll through the un-placed physical window until the desired instance was found, and place the instance. Thereafter, the circuit designer would typically examine the externally generated listing to identify the computer generated instance name associated with the driver of a second bit of the selected vectored net. The circuit designer would then scroll through the un-placed physical window until the desired instance was found, and place the instance. This would be repeated until all of the instances that drive the selected vectored net were placed.

To overcome these limitations, it is first recognized that although many of the instance names are computer generated, many synthesis tool retain the net names of vectored nets, because they are often defined in the high level behavioral level description of the circuit design. In many cases, the net names for each bit in a vectored net have a common prefix and a bit number suffix (for example, NET1(0)). Thus, by sorting the instances by, for example the net names associated with a corresponding output, a circuit designer may easily sequentially place all objects associated with a vectored net. In the present example, all drivers of a vectored net may be sequentially listed in a physical window, thereby allowing each instance to be easily placed in the floorplanning window.

FIG. 20B is a table showing an illustrative sorted unplaced physical window of a placement tool for the circuit design shown in FIG. 19, wherein the objects are sorted by a corresponding output net name. The table is generally shown at 680. The instances have been sorted alphabetically by the net name associated with the first output, as shown in the fourth column 686 of table 680. Thus, all instances that drive the net named PBUS(0–3) are shown first. Similarly, all instances that drive the net names XBUS(0–3) are shown next. Finally, all instances that drive the net named YBUS (0–3) are shown. Organized in this order, a circuit designer may place, for example, MUX021 628B. Thereafter, MUX021 628B will be moved from the un-placed physical window to the placed physical window. The placement tool may then automatically select the next succeeding instance, or in the case, MUX245 630B. The circuit designer may then place this instance. This process may continue until all instances for PBUS(0–3) are placed in the floorplanning window. It has been found that this feature has made the floorplanning process less tedious and less error-prone.

A further advantage of both of the net and instance sorting features described above is that they both may allow circuit designers to easily define object groups. This may allow user defined group operations to be more readily performed. For example, a circuit designer may place all drivers for a vectored net by first performing a net sort, and then placing the first component in the group and specifying a direction for further group placement. The placement tool may then incorporate features that allow the circuit designer to place all remaining cells in the group automatically, as described below with reference to FIG. 21. (see also, U.S. patent application Ser. No. 08/789,028, filed Jan. 27, 1997, which has been incorporated herein by reference). As indicated above, past placement tools may have required the circuit designer to manually find each instance name, one at a time, either from some external printout or by panning through the unsorted list within a physical window, and individually place each object.

Figure 21:
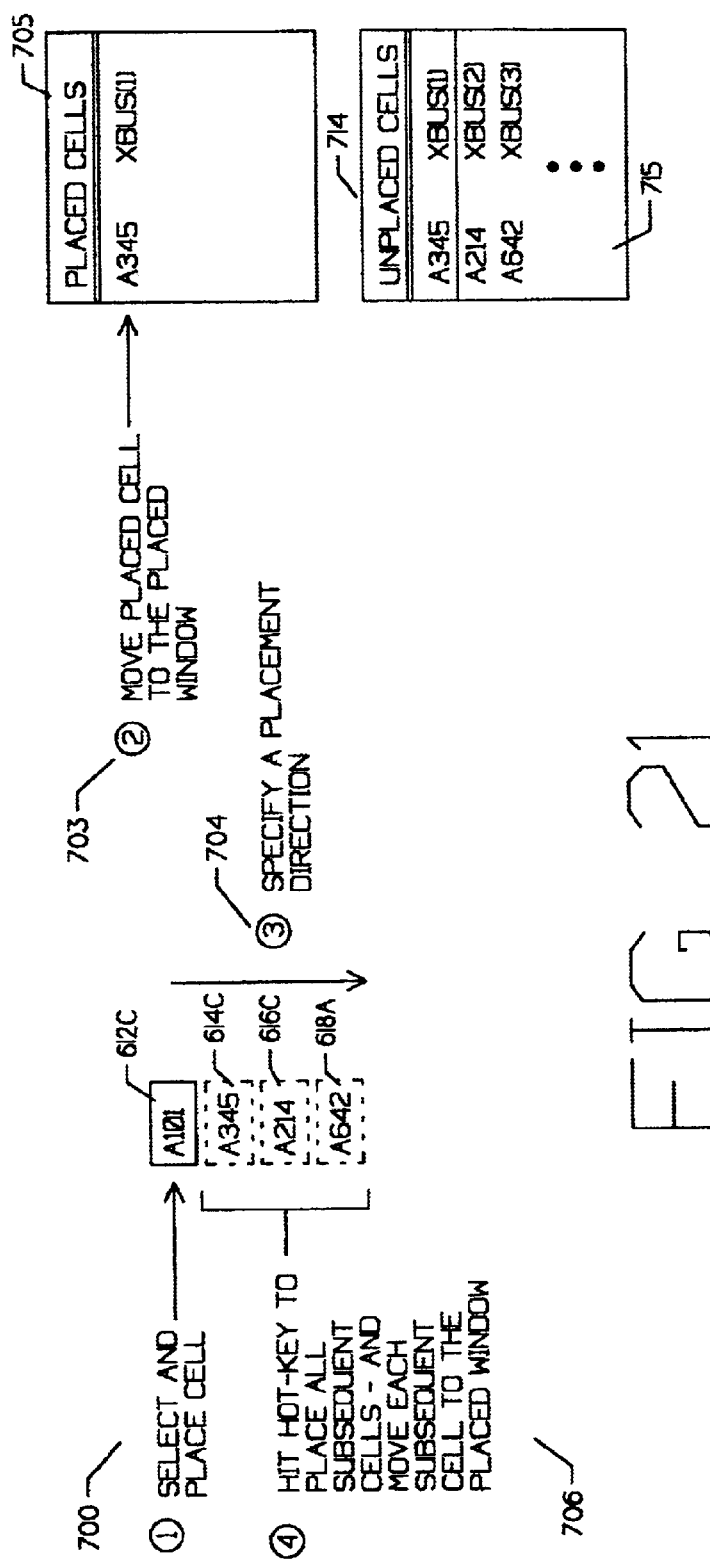
FIG. 21 is a diagram illustrating a cell placement method in accordance with the present invention.

FIG. 21 is a diagram illustrating a cell placement method in accordance with the present invention. The diagram illustrates the placement of A101 612C, A345 614C, A214 616C and A642 618C. These instances correspond to A101 612A, A345 614A, A214 616A and A642 618A of FIG. 19. In a first step, the circuit designer sorts the instances according to the net names associated with a corresponding pin. This step is shown and described with reference to FIG. 20A and FIG. 20B. The result is a sorted list of instances in the un-placed physical window.

The circuit designer then selects and places a desired instance in the floorplanning window, as shown at 700. The placement tool of the present invention then moves the placed instance from the un-placed physical window to the placed physical window, as shown at 703. In addition, the placement tool selects the next succeeding instance in the un-placed physical window. In the illustrative diagram, the next instance is A345 as shown at 715. The circuit designer provides a placement direction, as shown at 704. Although not shown, the circuit designer may also specify a cell spacing parameter to indicate the desired spacing between each cell. The circuit designer then hits a predefined hot-key, to indicate to the placement tool to place the remaining instances that are associated with the corresponding vector, as shown at 706. The placement tool may place the corresponding instances in the specified placement direction and at the specified placement spacing.

The placement tool may determine which of the subsequent instances are associated with the vectored net by analyzing the net name associated with the corresponding pin for each instance. For example, each of the net names associated with the output pin of A101 612C, A345 614C, A214 616C and A642 618C have a common prefix of "XBUS". By comparing the prefix of the net name associated with the output pin of A101 612C with the remaining instances, the placement tool may identify which of the instances are associated with the vectored net. Accordingly, the placement tool may place only those instances that are associated with the vectored net. Finally, the placement tool may move all of the instances that are placed to the placed physical window, as shown at 706.

Figure 22:
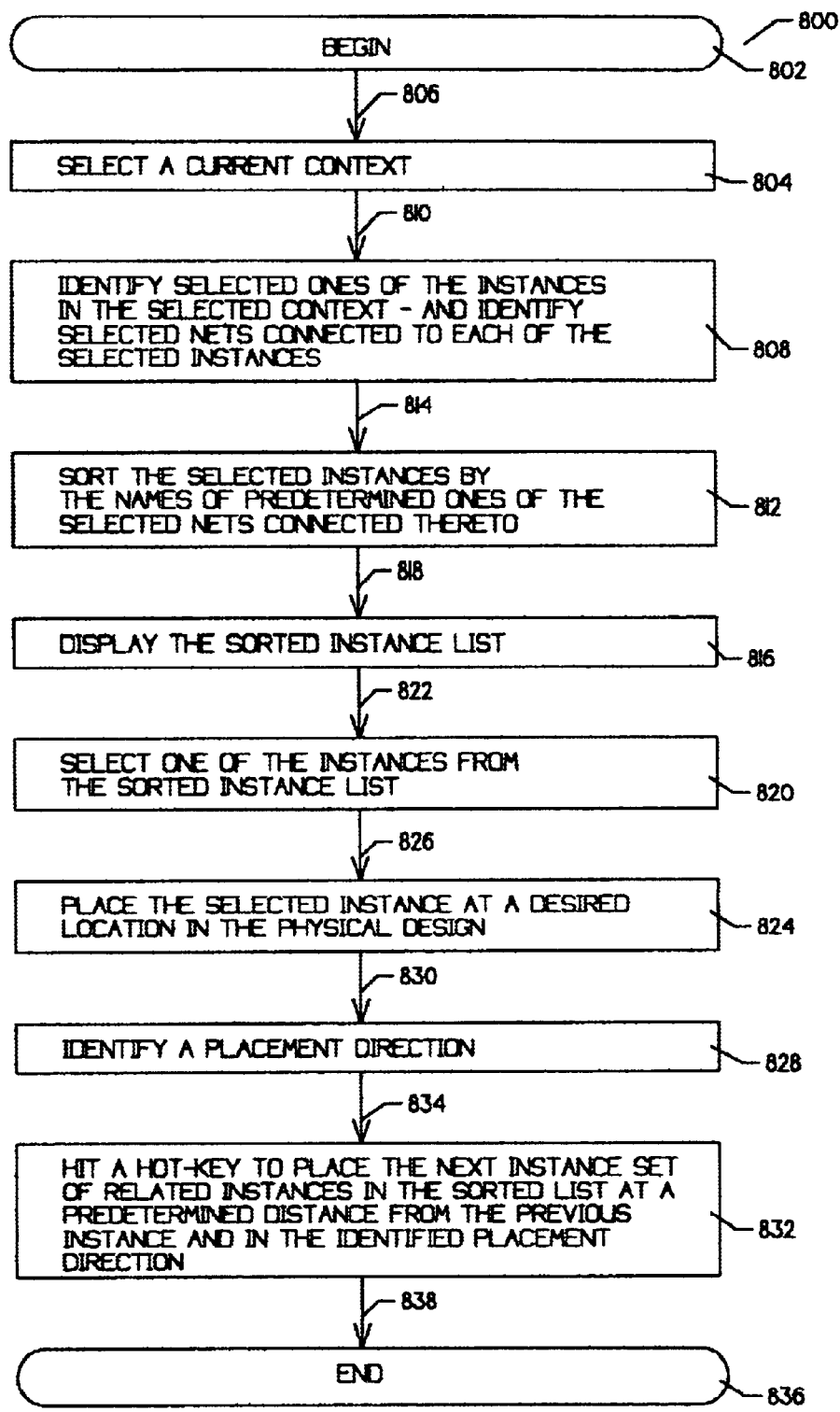
FIG. 22 is a flow diagram further illustrating the cell placement method of FIG. 21.

FIG. 22 is a flow diagram further illustrating the cell placement method of FIG. 21. The diagram is generally shown at 800, and is entered at element 802. Control is passed to element 804 via interface 806. Element 804 selects a current context. Control is then passed to element 808 via interface 810. Element 808 identifies selected ones of the instances in the selected context, and identifies selected nets connected to each of the selected instances. Control is then passed to element 812 via interface 814. Element 812 sorts the selected instances by the names of predetermined ones of the selected nets connected thereto. Control is then passed to element 816 via interface 818. Element 816 displays the sorted instance list. Control is then passed to element 820 via interface 822. Element 820 is selects one of the instances from the sorted instance list. Control is then passed to element 824 via interface 826. Element 824 places the selected instance at a desired location in the physical design. Control is then passed to element 828 via interface 830. Element 828 identifies a placement direction. Control is then passed to element 832 via interface 834. Element 832 places the next instance or set of instances in the sorted list at a predetermined distance from the previous instance and in the identified placement direction. In a preferred embodiment, the placement of these instances is initiated by a circuit designer depressing a predefined hot-key. Control is then passed to element 836 via interface 838, wherein the algorithm is exited.

Having thus described the preferred embodiments of the present invention, those of skill in the art will readily appreciate that the teachings found herein may be applied to yet other embodiments within the scope of the claims hereto attached.

We claim:

1. A method for selecting a number of items within a circuit design database using a placement tool wherein the placement tool displays at least a portion of the circuit design database on a display device, the circuit design database including a number regions wherein each of the number of regions reference selected ones of the number of items, the method comprising the steps of:
   a. selecting one of the number of regions, thereby resulting in a current active region;
   b. indicating a selection area on the display device wherein the selection area encompasses at least a portion of at least two of the number of regions including at least a portion of the current active region; and
   c. selecting only those items that correspond to the current active region and that are represented within the selection area.

2. A method according to claim 1 wherein the at least two regions that are at least in part encompassed by the selection area are at least in part overlapping.

3. A method according to claim 2 wherein selected ones of the number of items are leaf cells.

4. A method according to claim 3 wherein selected ones of the number of items are regions.

5. A method for selecting a number of regions within a circuit design database using a placement tool comprising:
   a. arranging the circuit design database to include a number of levels of hierarchy and a number of regions;
   b. displaying at least two regions at least in part, simultaneously on a display device;
   c. referencing selected ones of the number of regions by a corresponding region at a higher level in the design hierarchy;
   c. moving a cursor over a desired portion of the displayed circuit design on the display device;
   d. moving the cursor to a cursor location, wherein the cursor location is encompassed at least in part by at least two of the displayed regions; and
   e. depressing at least one predetermined down hot-key, causing the placement tool to select a selected one of the at least two displayed regions to the exclusion of the other at least two displayed regions.

6. A method according to claim 5 further comprising the steps of sequentially depressing the at least one predetermined down hot-key to sequentially select each of the at least two displayed regions that encompasses said cursor location.

7. A method according to claim 5 further comprising the step of:
   a. depressing at least one predetermined up hot-key, causing the placement tool to select the corresponding region that references the selected one of the at least two displayed regions.

8. A method for selecting instances within a circuit design database for placement using a placement tool comprising the steps of:
   a. allocating the circuit design database into a number of instances;
   b. associating an instance name with each of the number of instances;
   c. identifying a number of selected instances including the step of identifying those instances that are un-placed;
   d. sorting the number of selected instances, thereby resulting in a sorted instance list; and
   e. selecting an instance from the sorted instance list for placement.

9. A method according to claim 8 wherein the number of selected instances are sorted alphabetically by their instance names.

10. A method according to claim 9 wherein selected ones of the number of selected instances are regions.

11. A method according to claim 8 wherein the circuit design database has a number of levels of hierarchy, wherein each of the number of levels of hierarchy are called contexts, and wherein selected ones of the contexts reference predetermined ones of the number of instances.

12. A method according to claim 11 further comprising the step of selecting one of the contexts, thereby resulting in a selected context.

13. A method according to claim 12 wherein said identifying step identifies only those un-placed instances that are referenced within the selected context.

14. A method for selecting instances within a circuit design database for placement using a placement tool, the method comprising the steps of:
   a. dividing the circuit design database into a number of instances;
   b. coupling selected ones of the number of instances to predetermined other ones of the number of instances via at least one net;
   c. assigning to selected nets predefined net names;
   d. identifying a number of selected instances including the step of identifying those instances that are un-placed;
   e. sorting the selected instances, according to a predetermined one of the net names associated with each of the selected instances, thereby resulting in a sorted instance list; and
   f. selecting an instance from the sorted instance list for placement.

15. A method according to claim 14 wherein said sorting step sorts the selected instances by sorting the net names associated therewith alphabetically.

16. A method according to claim 15 wherein said sorting step sorts the selected instances by sorting the net names associated with a pre-identified output of each instance.

17. A method according to claim 15 wherein selected ones of the selected instances are regions.

18. A method according to claim 14 wherein the circuit design database has a number of levels of hierarchy, wherein each of the number of levels of hierarchy are called contexts, and wherein selected ones of the contexts reference predetermined ones of the number of instances.

19. A method according to claim 18 further comprising the step of selecting one of the contexts, thereby resulting in a selected context.

20. A method according to claim 19 wherein said identifying step identifies only those selected instances that are referenced within the selected context.

21. A method according to claim 14 further comprising the steps of:
   a. placing the selected instance, thereby resulting in a first placed cell;
   b. specifying a placement direction, relative to the first placed cell; and
   c. depressing a number of predefined hot-keys, causing a next subsequent instance in the sorted instance list to be placed a predetermined distance from the first placed cell, in the placement direction.

22. A data processing system comprising:
   a. means for selecting a number of items within a circuit design database wherein the data processing system displays at least a portion of the circuit design database on a display device, the circuit design database including a number regions wherein each of the number of regions reference selected ones of the number of items;
   b. first selecting means for selecting one of the number of regions, thereby resulting in a current active region;
   c. indicating means coupled to said selecting means for indicating a selection area on the display device, wherein the selection area encompasses at least a portion of at least two of the number of regions including at least a portion of the current active region; and
   d. second selecting means coupled to said indicating means and to said first selecting means for selecting only those items that correspond to the current active region and that are represented within the selection area.

23. A data processing system according to claim 22 wherein the at least two regions that are at least in part encompassed by the selection area are at least in part overlapping.

24. A data processing system comprising:
   a. a number of regions within a circuit design database, the circuit design database including a number of levels of hierarchy and a number of regions, wherein at least two regions are, at least in part, simultaneously displayed on a display device, selected ones of the number of regions being referenced by a corresponding region at a higher level in the design hierarchy, the placement tool allowing a user to move a cursor over a desired portion of the displayed circuit design on the display device;
   b. moving means for moving the cursor to a cursor location, wherein the cursor location is encompassed at least in part by at least two of the displayed regions; and
   c. hot-key means for causing the data processing system to select a selected one of the at least two displayed regions to the exclusion of the other at least two displayed regions.

25. A data processing system comprising:
   a. a circuit design database, wherein the circuit design database includes a number of instances, and wherein each of the number of instances has an instance name associated therewith;
   b. identifying means for identifying a number of selected instances;

c. sorting means coupled to said identifying means for sorting the number of selected instances, thereby resulting in a sorted instance list;

e. selecting means coupled to said sorting means for selecting an instance from the sorted instance list;

f. wherein said sorting means sorts the number of selected instances alphabetically by their instance names; and g. wherein said identifying means identifies only those instances that are un-placed.

26. A data processing system comprising:

a. a circuit design database, wherein the circuit design database includes a number of instances, and wherein selected ones of the number of instances are coupled to predetermined other ones of the number of instances via at least one net, wherein selected nets have pre-defined net names;

b. identifying means for identifying a number of selected instances;

c. sorting means coupled to said identifying means for sorting the selected instances, according to a predetermined one of the net names associated with each of the selected instances, thereby resulting in a sorted instance list;

d. selecting means coupled to said sorting means for selecting an instance from the sorted instance list;

f. placing means for placing the selected instance at a selected location within the circuit design, thereby resulting in a first placed cell;

g. specifying means for specifying a placement direction, relative to the first placed cell; and h. hot-keys means coupled to said placing means and said specifying means for causing a next subsequent instance in the sorted instance list to be placed a predetermined distance from the first placed cell, in the placement direction.

27. A data processing system according to claim 26 wherein said sorting means sorts the selected instances alphabetically according to the net associated therewith.

28. A data processing system according to claim 27 wherein said sorting means sorts the selected instances by sorting the net names associated with a pre-identified output of each instance.

* * * * *